(12) United States Patent
Huusari et al.

(10) Patent No.: US 10,666,304 B2
(45) Date of Patent: May 26, 2020

(54) APPARATUSES AND METHODS FOR COMPENSATING INTERFERING SIGNALS IN ELECTRIC CIRCUITS

(71) Applicant: INTEL CORPORATION, Santa Clara, CA (US)

(72) Inventors: Timo Huusari, Hillsboro, LA (US); Saku Lahti, Tampere (FI)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/326,713

(22) PCT Filed: Sep. 29, 2016

(86) PCT No.: PCT/IB2016/055819
§ 371 (c)(1),
(2) Date: Feb. 20, 2019

(87) PCT Pub. No.: WO2018/060757
PCT Pub. Date: Apr. 5, 2018

(65) Prior Publication Data
US 2019/0207633 A1    Jul. 4, 2019

(51) Int. Cl.
*H04B 1/04* (2006.01)
*H04B 1/525* (2015.01)
(Continued)

(52) U.S. Cl.
CPC ............. *H04B 1/0475* (2013.01); *H01P 5/18* (2013.01); *H03H 7/48* (2013.01); *H04B 1/10* (2013.01); *H04B 1/52* (2013.01); *H04B 1/525* (2013.01)

(58) Field of Classification Search
CPC .......... H04B 1/0475; H04B 1/10; H04B 1/52; H01P 5/18; H03H 7/48
See application file for complete search history.

(56) References Cited

U.S. PATENT DOCUMENTS

| 5,304,961 A | 4/1994 | Dydyk |
| 5,543,721 A * | 8/1996 | Knuuti ................. G01R 27/06 324/647 |

(Continued)

FOREIGN PATENT DOCUMENTS

WO        02-103922 A1    12/2002

OTHER PUBLICATIONS

Y.-S. Choi et. al, "Simultaneous Transmission and Reception: Algorithm, Design and System Level Performance", IEEE Transactions on Wireless Communications, vol. 12, No. 12, Dec. 2013.

*Primary Examiner* — Nguyen T Vo
(74) *Attorney, Agent, or Firm* — 2SPL Patent Attorneys

(57) ABSTRACT

An electric circuit includes a compensation circuit. The compensation circuit includes at least one directional coupler with an adjustable coupling factor. The compensation circuit is coupled between a first signal path and a second signal path of the electric circuit via the at least one directional coupler. Furthermore, the electric circuit includes a detector circuit coupled at least to the second signal path. The detector circuit is configured to detect an interfering signal portion of a signal of the first signal path in the second signal path. Furthermore, the electric circuit includes a control circuit. The control circuit is configured to adjust a transfer characteristic of the compensation circuit based on the detected interfering signal portion. Adjusting the transfer characteristic includes adjusting the coupling factor of the at least one directional coupler.

21 Claims, 16 Drawing Sheets

(51) Int. Cl.
  *H01P 5/18* (2006.01)
  *H03H 7/48* (2006.01)
  *H04B 1/10* (2006.01)
  *H04B 1/52* (2015.01)

(56) References Cited

U.S. PATENT DOCUMENTS

| | | |
|---|---|---|
| 2004/0106381 A1 | 6/2004 | Tiller |
| 2004/0119559 A1 | 6/2004 | Shumovich |
| 2013/0207741 A1 | 8/2013 | Presti |
| 2014/0253247 A1* | 9/2014 | Satomi .................. H03F 3/68 330/295 |
| 2016/0094331 A1* | 3/2016 | White .................. H04B 1/525 370/278 |

* cited by examiner

301 —— Ct1=0.5pF, Ct2=1.3pF
302 —— Ct1=5.2pF, Ct2=0.8pF
303 —— Ct1=9pF, Ct2=0.5pF

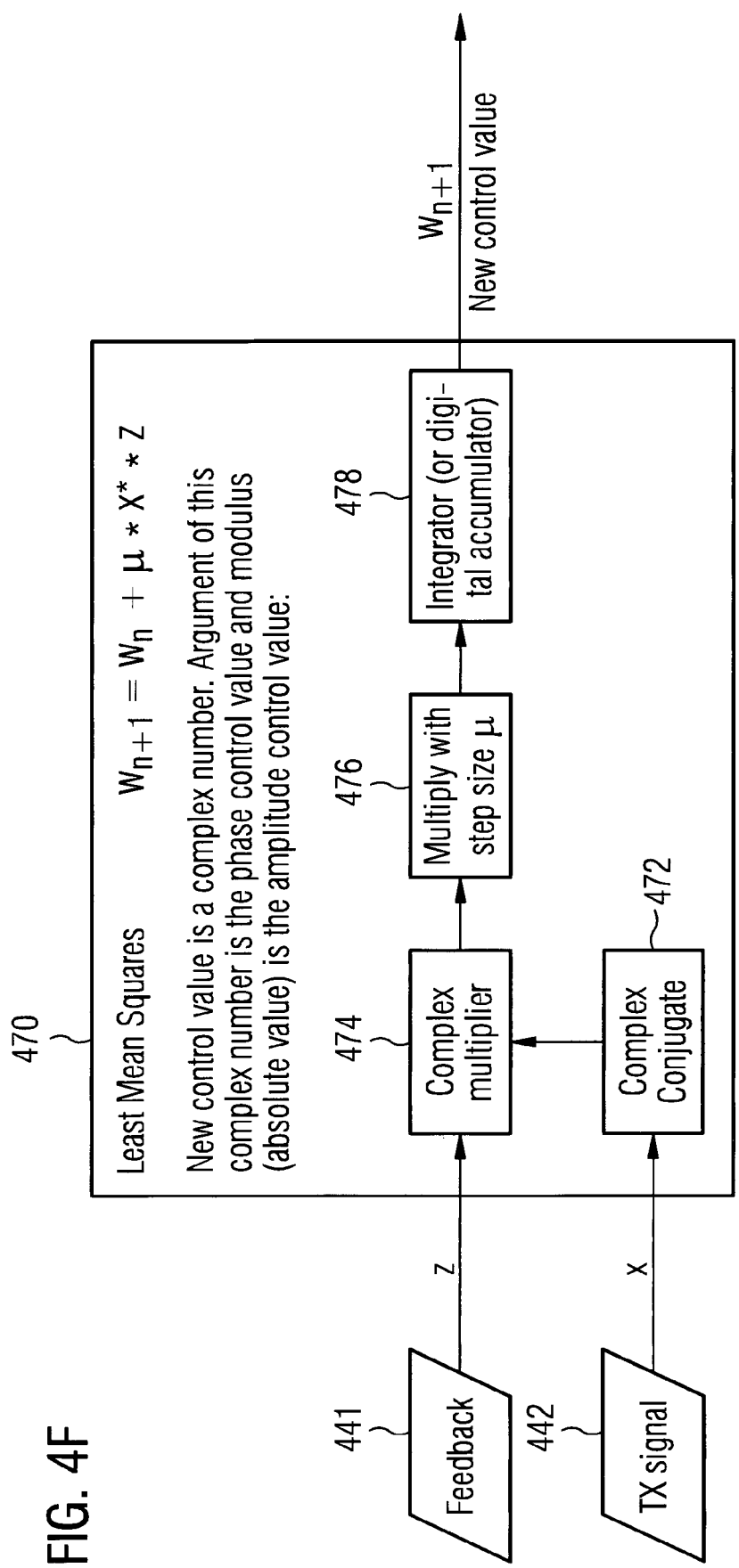

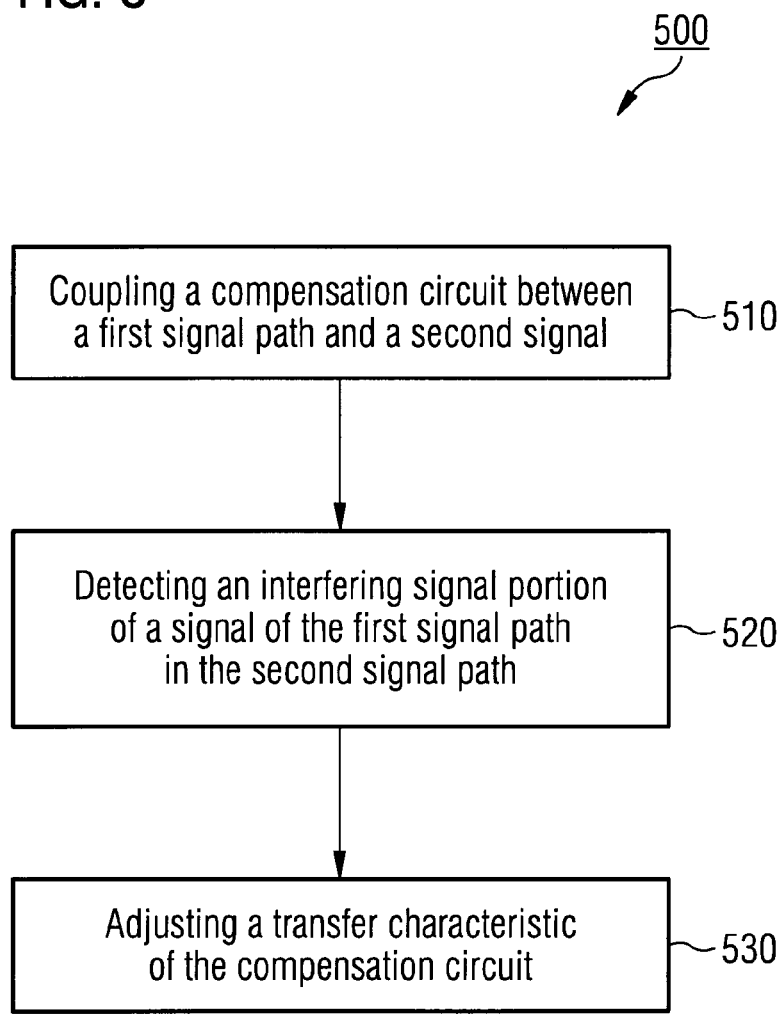

APPARATUSES AND METHODS FOR COMPENSATING INTERFERING SIGNALS IN ELECTRIC CIRCUITS

FIELD

Examples relate to apparatuses and methods for signal processing, and more particularly, to electric circuits for telecommunication applications.

BACKGROUND

The ever increasing demand for higher data rates, larger bandwidth and faster electronic circuits keeps posing new challenges in the fields of telecommunication and electronics. For example, the arrival of the smart phone and the ability to go online almost anywhere on the planet have created the necessity to provide a rapidly growing amount of users with large volumes of data. Hence, there is a desire to provide improved concepts for electric circuits used in telecommunication applications enabling higher data rates, operating more reliably and/or featuring reduced power consumption.

BRIEF DESCRIPTION OF THE FIGURES

Some examples of apparatuses and/or methods will be described in the following by way of example only, and with reference to the accompanying figures, in which

FIG. 4F shows a further flow chart for a control algorithm for amplitude and phase setting of a compensation circuit; and FIG. 5 shows a flow chart of an interference cancellation method.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
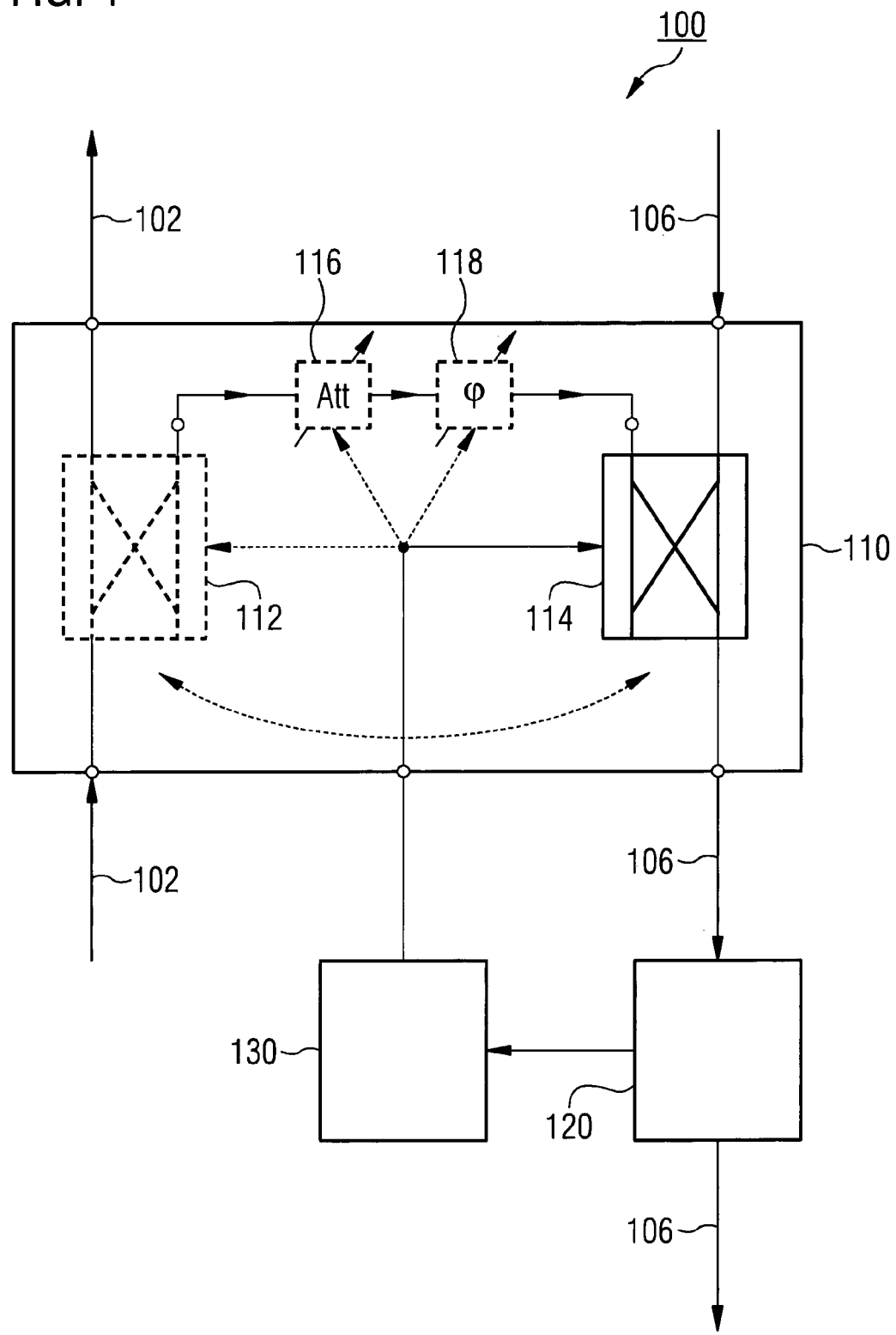
FIG. 1 shows a block diagram of an electric circuit.

FIG. 1 shows a block diagram of an electric circuit 100. The electric circuit 100 comprises a compensation circuit 110. The compensation circuit 110 comprises at least one directional coupler 112, 114 with an adjustable coupling factor. The compensation circuit 110 is coupled between a first signal path 102 and a second signal path 106 of the electric circuit 100 via the at least one directional coupler 112, 114. Furthermore, the electric circuit 100 comprises a detector circuit 120 coupled at least to the second signal path 106. The detector circuit 120 is configured to detect an interfering signal portion of a signal of the first signal path 102 in the second signal path 106. Furthermore, the electric circuit 100 comprises a control circuit 130. The control circuit 130 is configured to adjust a transfer characteristic of the compensation circuit based on the detected interfering signal portion. Adjusting the transfer characteristic comprises adjusting the coupling factor of the at least one directional coupler 112, 114.

The electric circuit 100 can be employed for numerous applications, where there may be crosstalk from one signal path (e.g., the first signal path 102) to another signal path (e.g., the second signal path 106). The detector circuit 120 can detect an interfering signal portion of a signal of the first signal path 102 in the second signal path 106 and may thus have information about magnitude (e.g., power and/or voltage) and/or phase of the interfering signal portion in the second signal path 106. The detector circuit 120 can communicate this information to the control circuit 130. In turn, the control circuit 130 can adjust the transfer characteristic of the compensation circuit 110 based on the magnitude and/or phase information of the interfering signal portion and couple a compensating signal portion of the signal from the first signal path 102 to the second signal path 106. For compensating the interfering signal portion, the transfer characteristic (e.g., a magnitude and/or phase response) of the compensating circuit 110 can be adjusted by the control circuit 130. For example, the control circuit 130 can adjust the magnitude and/or the phase of a coupling factor of the directional coupler that couples the compensation circuit 110 to the first or to the second signal path. The compensating signal portion can then be essentially equal in magnitude and opposite in phase relative to the interfering signal portion. In consequence, the compensating signal portion can at least partially (or fully) compensate the interfering signal portion in the second signal path 106. A signal (e.g., a second signal or a desired signal) can then propagate along the second signal path 106 being less (or being not) disturbed by a cross coupling signal (e.g., a first signal) from the first signal path 102.

By compensating crosstalk from the first signal path 102 caused on the second signal path 106, signals can be conducted simultaneously on the first and on the second signal path 102, 106, for example. This can result in a higher throughput of data of the electric circuit 100 and/or may make the electric circuit 100 operate more reliably, because signals on the second signal path 106 may suffer from less interference. The adjustable directional coupler 112, 114 provides means for adjusting the transfer characteristic of the compensation circuit 110, but also allows in cases of low or no cross coupling to be set to a low coupling factor (e.g., less than −15 dB, or less than −20 dB). In turn, an insertion loss caused by the directional coupler 112, 114 in the first and/or the second signal path 102, 106 can be reduced under such conditions. This can reduce the average power consumption of the electric circuit 100 and/or further improve the operational reliability of the electric circuit 100.

Applications of the electric circuit 100 may be in the fields of radio frequency (RF) or optical devices, such as any kinds RF- or optical transceivers used for telecommunication, measurement, sensor, and/or bio-medical purposes, in the fields of nano-electronics, for example in integrated digital circuits, or in the fields of power electronics, where crosstalk may be caused by strong transient signals. The electric circuit 100 may be realized on an electrical system level, a circuit board level and/or on an integrated circuit level.

As indicated in FIG. 1, it is generally optional, whether the compensation circuit 110 is coupled to the first signal path 102 or to the second signal path 106 via the adjustable directional coupler. To couple the compensation circuit 110 also to the remaining signal path (e.g., the first or the second signal path that is not coupled to via the adjustable directional coupler) various means are possible.

One possibility is to couple the compensation circuit 110 to the remaining signal path via a power splitter or a power combiner or to simply join a conductor at an input or at an output of the compensation circuit 110 with the remaining signal path.

Alternatively, the compensation circuit 110 can comprise a first directional coupler 112 and a second directional coupler 114. A coupling factor of at least one of the first and the second directional coupler can be adjustable. The compensation circuit 110 can be coupled to the first signal path 102 via the first directional coupler 112 and can be coupled to the second signal 106 path via the second directional coupler 114. The control circuit 130 can be configured to adjust the coupling factor of at least one of the first and the second directional coupler 112, 114 based on the detected interfering signal portion. By coupling the compensation circuit 110 via directional couplers to the first and to the second signal path, insertion loss and/or reflections occurring in the signal paths due coupling them to the compensation circuit 110 can be lower than when using power splitters, power combiners and/or joining conductors.

To couple the compensation circuit 110 to the first signal path 102 via the first directional coupler 112 and/or to couple the compensation circuit 110 to the second signal path 106 via the second directional coupler 114, the input-port and the through-port of the directional coupler can be coupled to the signal path (e.g., the first signal path 102 and/or the second signal path 106, respectively), whereas the coupled port of the directional coupler can be coupled to further circuitry of the compensation circuit 110. The further circuitry of the compensation circuit 110 may comprise at least a transmission line. The transmission line can connect the coupled port of the first directional coupler 112 with the coupled port of the second directional coupler 114.

The coupled port of the first directional coupler 112 may receive portions of signals (e.g., the compensating signal portion) entering the input-port of the first directional coupler 112. In other words, the first directional coupler 112 may be used under the purpose of coupling power out of the first signal path 102 into the compensation circuit 110. The through-port of the second directional coupler 114 coupled to the second signal path 106 may receive portions of signals (e.g., the compensating signal portion) entering the coupled port of the second directional coupler 114. That is to say, the second directional coupler 114 may be used under the purpose of coupling power out of the compensation circuit 110 into of the second signal path 106. Isolated and/or unused ports of the first and/or second directional coupler 112, 114 may be terminated by non-reflective terminators (e.g., matched wave terminations).

Yet another possibility for coupling the compensation circuit 110 between the first and the second signal path is to couple the compensation circuit 110 to the second signal path 106 via the adjustable directional coupler 114 and to couple the compensation circuit 110 to the first signal path 102 by providing the compensation circuit 110 with information about signals of the first signal path 102. For example, the control circuit 130 can have a-priori knowledge about signals of the first signal path 102 and can pass the information about signals of the first signal path 102 to the compensation circuit 110. The compensation circuit 110 may then create replicas of signals of the first signal path 102 and couple these to the second signal path 106 to compensate the interfering signal portion by adjusting the magnitude and phase of the replicas via the adjustable directional coupler 114 coupled to the second signal path 106. Information about signals of the first signal path 102 may, for example, be deduced by the detector circuit 120 that may be additionally coupled to the first signal path 102 and that may pass this information to the control circuit 130.

Optionally, the compensation circuit 110 (e.g., the further circuitry of the compensation circuit 110) can additionally comprise at least one phase shifter 118 with an adjustable phase shift. The control circuit 130 can be configured to adjust the phase shift based on the detected interfering signal portion. The optional additional phase shifter 118 can be used for adjusting the phase of the compensating signal portion to 180 degrees relative to the interfering signal portion in the second signal path 106. This provides an additional degree of freedom for the control circuit 130 to adjust the transfer characteristic of the compensation circuit 110. The adjustable coupler (or adjustable couplers 112, 114) can then be used for adjusting an overall attenuation (e.g., the magnitude response) of the compensation circuit 110.

In some examples, where the compensation circuit comprises a first directional coupler 112 and a second directional coupler 114, a first coupling factor of the first directional coupler 112 and a second coupling factor of the second directional coupler 114 can be both adjustable. The control circuit 130 can be configured to adjust a first portion of an overall attenuation of the compensation circuit 110 via adjusting the first coupling factor and to adjust a second portion of the overall attenuation via adjusting the second coupling factor. By both the first directional coupler 112 and the second directional coupler 114 being adjustable in their coupling factors, the dynamic range of the compensation circuit 110 may be increased, for example, by 20 dB (decibel) or more. The compensation circuit 110 can then be used for compensating strong interfering signal portions (e.g., of 6 dBc to 20 dBc of power below the power of the signal of the first signal path 102) and also weaker interfering signal portions (e.g., of 20 dBc to 40 dBc of power below the power of the signal of the first signal path 102 or even lower).

The overall attenuation of the compensation circuit 110 can correspond to the attenuation from the input-port of the first directional coupler 112 via the compensation circuit 110 to the through-port of the second directional coupler 114. This overall attenuation may be divided into different portions due to different circuit elements of the compensation circuit 110. The first portion of the overall attenuation may correspond to the first coupling factor of the first directional coupler 112 (e.g., may be equal to the inverse of the first coupling factor). For example, if the coupling factor is −10 dB, the first portion of the overall attenuation is 10 dB. Analogously, the second portion of the overall attenuation may correspond to the second coupling factor of the second directional coupler 114 (e.g., may be equal to the inverse of the second coupling factor). Additional portions (adjustable or fixed) of the overall attenuation may be due to the insertion loss of additional circuit elements of the compensation circuit 110. By dividing the overall attenuation into different portions of different circuit elements, ripples in the magnitude response of the compensation circuit 110 may be reduced, which can lead to a more effective compensating of the interfering signal portion.

Additionally, the compensation circuit 110 can further comprise at least one attenuator 116 with an adjustable attenuation. The attenuator 116 can be coupled between the first directional coupler 112 and the second direction coupler 114. The control circuit 130 can be configured to partially adjust the overall attenuation of the compensation circuit 110 via adjusting the attenuation of the attenuator 116 and to partially adjust the overall attenuation via adjusting the coupling factor of at least one of the first directional coupler 112 and the second directional coupler 114.

For example, a compensation circuit 110 comprising the optional additional attenuator 116 may comprise an adjustable first directional coupler 112 and a fixed second directional coupler 114, or may comprise a fixed first directional coupler 112 and an adjustable second directional coupler 114, or may comprise an adjustable first directional coupler 112 and an adjustable second directional coupler 114. In another example, the compensation circuit 110 comprising the optional additional attenuator 116 may be coupled by only one adjustable directional coupler to either the first signal path 102 or the second signal path 106 and may be coupled to the remaining signal path by other means (e.g., by a power splitter, power divider, a joining conductor, or by receiving information about the signal from the first signal path 102). The additional attenuator 116 can further increase the dynamic range of the overall attenuation of the compensation circuit 110 and/or provide an additional degree of freedom for adjusting the coupling factor of the first and/or the second directional coupler. 112, 114 In other words, providing the additional attenuator 116 to the compensation circuit 110 can give flexibility for adjusting the coupling factor of the first and/or the second directional coupler 112, 114, for example.

In some examples, the compensation circuit 110 can comprise a vector modulator. For example, the optional attenuator 116 and the optional phase shifter 118 can be integrated into the vector modulator. The control circuit 130 can then adjust the overall attenuation of the compensation circuit by controlling an attenuation (and/or an amplification) of the vector modulation and can adjust the phase response of the transfer characteristic of the compensation circuit 110 by adjusting the phase shift of the vector modulator.

A compensation circuit 110 comprising at least two degrees of freedom for adjusting its overall attenuation can for example comprise at least one adjustable directional coupler 112, 114 and an adjustable attenuator 116 (or a vector modulator). Alternatively for comprising at least two degrees of freedom for overall attenuation adjustment, the compensation circuit 110 can comprise at least an adjustable first directional coupler 112 and an adjustable second directional coupler 114 without the adjustable attenuator 116 (or a vector modulator), but may also comprise additionally the adjustable attenuator 116 (or a vector modulator) resulting in three degrees of freedom for adjusting the overall attenuation.

According to an example, the compensation circuit 110 comprises at least two degrees of freedom for overall attenuation adjustment and is coupled to the first signal path 102 via an adjustable first directional coupler 112. The control circuit 130 can then be configured to decrease the coupling factor of the first directional coupler 112, if a strength (e.g., a power, voltage and/or current) of the signal of the first signal path 102 exceeds a signal strength threshold. Simultaneously, the control circuit 130 may increase the coupling factor of the second directional coupler and/or decrease the attenuation of the adjustable attenuator 116 to keep the overall attenuation constant and to hence compensate the interfering signal portion in the second signal path 106. The decreased coupling factor of the first directional coupler 112 can however reduce the insertion loss of the first directional coupler 112 in the first signal path 102 and increase the attenuation of the first directional coupler 112 caused in the compensation circuit 110. This may reduce the power consumption of the electric circuit 100 as less power of the signal in the first signal path 102 may be lost and less power may be recovered by power consuming amplification, for example. The increased attenuation of the first directional coupler 112 caused in the compensation circuit 110 may protect the compensation circuit 110 from being overdriven by strong signals of the first signal path 102.

The detector circuit 120 may be additionally coupled to the first signal path 102 to determine the strength of the signal of the first signal path 102. Additionally or alternatively, the electric circuit 100 can comprise an additional power (and/or voltage and/or current) detector coupled to the first signal path 102 to determine the strength of the signal of the first signal path 102. The signal strength threshold may, for example, be a (fixed) design parameter of the electric circuit 100 and may be set larger than −20 dBm (or larger than 0 dBm, or larger than 20 dBm, or larger than 40 dBm) and/or lower than 70 dBm (or lower than 50 dBm, or lower than 30 dBm, or lower than 10 dBm).

Optionally, the control circuit 130 can be configured to adjust the coupling factor of the first directional coupler 112 to a first value given a first strength of the signal of the first signal path and to adjust the coupling factor of the first directional coupler 112 to a second value given a second strength of the signal. For example, the first value (of the coupling factor of the first directional coupler 112) is smaller than the second value (of the coupling factor of the first directional coupler 112) and the first strength of the signal is larger than the second strength of the signal. In this way, when the strength of the signal of the first signal path 102 is large, the first directional coupler 112 is adjusted to a lower coupling factor as when the strength of the signal of the first signal path 102 is smaller, for example. This can decrease the insertion loss in the first signal path 102 with increasing strength of the signal in the first signal path 102.

According to an example, the compensation circuit 110 is coupled to the second signal path 106 via an adjustable second directional coupler 114 and comprises at least another degree of freedom for adjusting its overall attenuation (e.g., an adjustable first directional coupler 112 and/or an adjustable attenuator 116). The control circuit 130 can then be configured to decrease the coupling factor of the second directional coupler 114, if a strength of a second signal (e.g., of a desired second signal) of the second signal path 106 falls below a second signal strength threshold. Simultaneously, the control circuit 130 may increase the coupling factor of the first directional coupler 112 and/or decrease the attenuation of the adjustable attenuator 116 to keep the overall attenuation constant and to hence compensate the interfering signal portion in the second signal path 106.

Additionally or alternatively, the control circuit 130 can be configured to adjust the coupling factor of the second directional coupler 114 to a first value given a first strength of the second signal of the second signal path 106 and to adjust the coupling factor of the second directional coupler 114 to a second value given a second strength of the second signal. The first value (of the coupling factor of the second directional coupler 114) is smaller than the second value (of the coupling factor of the second directional coupler 114) and the first strength of the second signal is smaller than the second strength of the second signal, for example. In other words, when the strength of the second signal in the second signal path 106 is small (e.g., when the strength of the second signal falls below the second signal strength threshold or when it is smaller compared to a second strength), the insertion loss due to the second directional coupler 114 in the second signal path 106 can be reduced by decreasing the coupling factor of the second directional coupler 114. In turn, this can decrease the noise figure of the second signal path 106 when the strength of the second signal is low. In this way, a detection, reception, demodulation and/or evaluation of the second signal of the second signal path 106 can be made more reliable due to the decreased noise figure of the second signal path 106. The second signal strength threshold can be a (fixed) design parameter of the electric circuit 100 and can be lower than 0 dBm (or lower than −20 dBm, or lower than −40 dBm, or lower than −60 dBm) and/or higher than −100 dBm (or higher than −80 dBm, or higher than −50 dBm, or higher than −30 dBm), for example.

According to an example, the compensation circuit 110 comprises an adjustable attenuator 116 and at least one adjustable directional coupler (e.g., the first directional coupler 112 and/or the second directional coupler 114 is adjustable). The control circuit 130 can be configured to decrease the coupling factor of at least one of the first and the second directional coupler 112, 114 and to decrease the attenuation of the attenuator 116 if the attenuation of the attenuator 116 exceeds an upper attenuation threshold level. In this way, the overall attenuation of the compensation circuit can be kept constant (or be adjusted) to compensate the interfering signal portion in the second signal path 106 by providing the compensating signal portion to the second signal path having approximately the same magnitude as the interfering signal portion (and being shifted by approximately 180° in phase relative to the interfering signal portion). However, the attenuation of the attenuator 116 can be decreased as it exceeds the upper attenuation threshold level for the sake of decreasing the coupling factor of the first directional coupler 112 and/or the second directional coupler 114. This can reduce the insertion loss of the first directional coupler 112 in the first signal path 102 and/or can reduce the insertion loss of the second directional coupler 114 in the second signal path 106, respectively. Additionally, clipping of the attenuator 116 at its maximum attenuation level can be avoided in this manner. The upper attenuation threshold level of the attenuator 116 can be a (fixed) design parameter of the electric circuit 100. For example, the upper attenuation threshold level can be the maximum attenuation of the attenuator 116 (or of a vector modulator comprising the attenuator 116) or can correspond to an attenuation value below the maximum attenuation (e.g., more than 0.5 dB, more than 2 dB, more than 8 dB, or more than 16 dB below the maximum attenuation and/or less than 20 dB below the maximum attenuation). Of course, the upper attenuation threshold level may also be any fixed attenuation level of the attenuator 116.

Additionally, the control circuit 130 can be configured to increase the coupling factor of at least one of the first and the second directional coupler 112, 114 and to increase the attenuation of the attenuator 116 if the attenuation of the attenuator 116 falls below a lower attenuation threshold level. For example, when the attenuation of the attenuator 116 falls below the lower attenuation threshold level, this can be an indication to the control circuit 130 that the first and/or the second directional coupler couple too little power to the compensation circuit to compensate the interfering signal portion in the second signal path 106. By increasing the coupling factor of the first and/or the second directional coupler 112, 114 more power can be coupled to the compensation circuit, such that the strength of the compensating signal portion can be enhanced. Additionally, clipping of the attenuator 116 at its minimum attenuation level can be avoided in this manner.

The lower attenuation threshold level can be a (fixed) design parameter of the electric circuit 100. For example, the lower attenuation threshold level can be the minimum attenuation of the attenuator 116 (or of a vector modulator comprising the attenuator 116) or can correspond to an attenuation value above the minimum attenuation (e.g., more than 0.5 dB, more than 2 dB, more than 8 dB, or more than 16 dB above the minimum attenuation and/or less than 20 dB above the minimum attenuation). The lower attenuation threshold level may also be any fixed attenuation level of the attenuator 116. Moreover, the lower attenuation threshold level is smaller than the upper attenuation threshold level, for example.

Additionally, the control circuit 130 can be configured to iteratively adjust the coupling factor of at least one of the first directional coupler 112 and the second directional coupler 114 until the attenuation of the attenuator 116 is set between the lower attenuation threshold level and the upper attenuation threshold level. This can balance (or distribute) the overall attenuation of the compensation circuit 110 between the attenuator 116 and the first and/or second directional coupler 112, 114. In this manner, it may can be ensured, that the first and/or the second directional coupler couple neither too much nor too little power to (or from, respectively) the compensation circuit 110. Hence, while adjusting the coupling factor of the first and/or the second directional coupler 112, 114 to provide the right amount of power to the compensating signal portion to compensate the interfering signal portion, the coupling factor(s) may be adjusted in such a manner to provide the best tradeoff between compensating the interfering signal portion and causing the least amount of insertion loss in the first and/or the second signal path 102, 106.

The detector circuit 120 can comprise a power (and/or voltage and/or current) detector. Additionally or alternatively, the detector circuit can comprise receiver circuitry for demodulating and/or analyzing signals (e.g., the second signal and/or the interfering signal portion) in the second signal path 106. For example, the detector circuit 120 can be configured to detect errors (e.g., bit errors) in the signals of the second signal path 106. The detected power (and/or voltage and/or current) and/or the detected errors of signals in the second signal path 106 can be indicative for a strength of the interfering signal portion in the second signal path 106.

For example, the detector circuit 120 may couple out a portion of a signal in the second signal path 106 via an additional directional coupler or may analyze the signal of the second signal path 106 itself (e.g., without use of an additional coupler). The detector circuit 120 may analyze the signal (or portion of the signal) of the second signal path 106 at digital baseband and/or at an intermediate frequency and/or at a frequency of the signal of the second signal path 106. The detector circuit 120 can also be a receiver circuit comprised by the electric circuit 100. This receiver circuit can, for instance, be used for demodulating a desired signal of the second signal path as well as for detecting the interfering signal portion in the second signal path 106.

The control circuit 130 can comprise a microprocessor and/or at least a part of a central computing unit and may be configured to adjust the first and/or the second directional coupler 112, 114 and/or the attenuator 116 and/or the phase shifter 118 (and/or a vector modulator of the compensation circuit 110) by sending command signals to these entities. For example the control circuit 130 can be connected to the compensation circuit 110 and/or to the detector circuit 120 via a serial peripheral interface bus. For example, the control circuit 130 can be configured to (iteratively) adjust the transfer characteristic of the compensation circuit 110 until a power detected by the detector circuit 120 in the second signal path 106 has become minimal. When the (average) power in the second signal path 106 has become minimal, this can be indicative for that the interfering signal portion has at least been partially compensated as the interfering signal portion may be uncorrelated to the second (desired) signal in the second signal path 106.

In some examples, the electric circuit 100 comprises a transceiver. The first signal path 102 can be a transmit signal path of the transceiver and the second signal path 106 can be a receive signal path of the transceiver. In this way, transmit signals, which are often of a much higher power (e.g., more than 10 dB, more than 20 dB, more than 40 dB, or more than 60 dB higher) as receive signals and that may cross-couple into the receive signal path and hence disturb the reception of the receive signals, can be at least partially compensated in the receive signal path. This may improve the reception of receive signals of the transceiver.

For example, the transceiver can be configured to transmit a first signal (e.g., a transmit signal) via the first signal path 102 and to simultaneously receive a second signal (e.g., a receive signal) via the second signal path 106. By being able to compensate an interfering signal portion caused by the first signal in the second signal path 106, this simultaneous transmission and reception of the transceiver may become possible. Additionally, the reception may become more reliable due to being able to reduce the noise figure of the second signal path 106 by an adjustable second directional coupler 114, for example. Additionally, the transmit power efficiency may be improved due to being able to reduce the insertion loss in the first signal path by an adjustable first directional coupler 112, for example. In telecommunication systems the usage of the proposed transceiver can increase (e.g., double) the bandwidth and/or increase the data rate of telecommunication. The first and the second signal can comprise different or same frequencies (e.g., carrier frequencies). According to an example, the first and the second signal comprise the same frequency (e.g., the transceiver is a full duplex transceiver).

Figure 2:
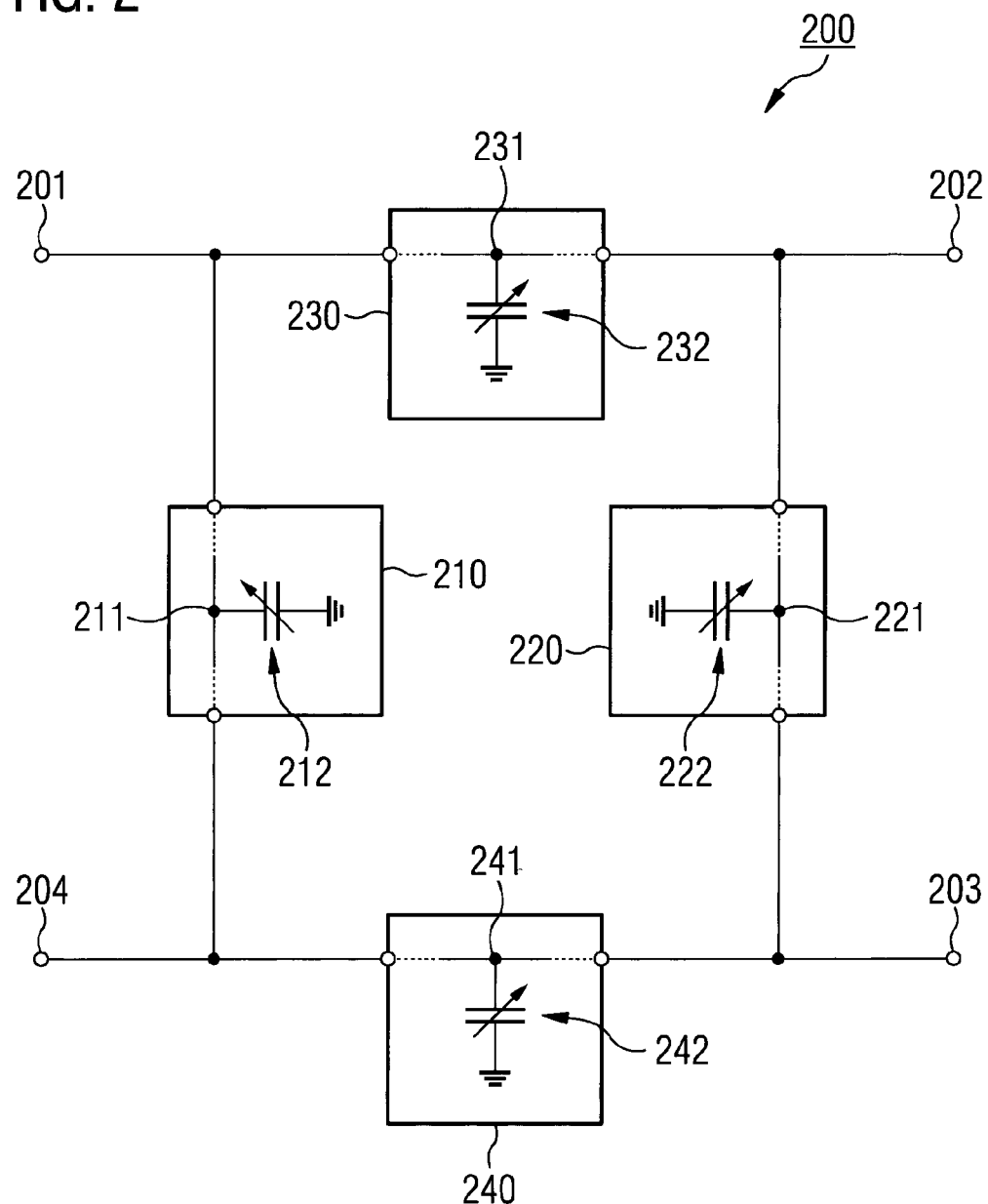
FIG. 2 shows a block diagram of an adjustable directional coupler 200.

FIG. 2 shows a block diagram of a directional coupler 200. The directional coupler 200 is adjustable, meaning that the coupling factor of the directional coupler 200 can be adjusted. Moreover, the directional coupler 200 can be used as an adjustable directional coupler for the electric circuit 100 of FIG. 1, for example.

The directional coupler 200 comprises a first T-network 210 coupled between an input-port 201 of the directional coupler 200 and an isolated-port 204 of the directional coupler 200. The first T-network 210 comprises a first adjustable shunt capacitive element 212 coupled between a central node 211 of the first T-network 210 and ground. Furthermore, the directional coupler 200 comprises a second T-network 220 coupled between a through-port 202 of the directional coupler 200 and a coupled-port 203 of the directional coupler 200. The second T-network 220 comprises a second adjustable shunt capacitive element 222 coupled between a central node 221 of the second T-network 220 and ground. Furthermore, the directional coupler 200 comprises a third T-network 230 coupled between the input-port 201 and the through-port 202. The third T-network 230 comprises a third adjustable shunt capacitive element 232 coupled between a central node 231 of the third T-network 230 and ground. Furthermore, the directional coupler 200 comprises a fourth T-network 240 coupled between the isolated-port 204 and the coupled-port 203. The fourth T-network 240 comprises a fourth adjustable shunt capacitive element 242 coupled between a central node 241 of the fourth T-network 240 and ground.

The first, second, third and fourth adjustable shunt capacitive elements 212, 222, 232, 242 are adjustable in the sense that their capacitance can be adjusted (e.g., tuned). By adjusting the first and/or the second adjustable shunt capacitive element 212, 222 the coupling factor of the directional coupler 200 can be set to different values, for example, to values ranging between −3 dB and −30 dB (but also values lower than −30 dB are possible). Integrating an adjustable capacitive element into a T-network can allow combing the adjustable capacitive element with additional passive elements (e.g., capacitors, inductors, or resistors), for example. This may allow shifting the tuning range (e.g., the possible capacitance values to which an adjustable capacitive element can be set) to a different range of values. For example, a tuning range from 0.5 pF (pico-farad) to 10 pF may be shifted to a new tuning range ranging from 0.1 pF to 0.5 pF by integrating an adjustable capacitive element into a T-network and coupling the adjustable capacitive element between a central node of the T-network and ground.

While the first and the second adjustable shunt capacitive elements 212, 222 can be used to adjust the coupling factor of the directional coupler 200, changing the capacitance of the first and second adjustable shunt capacitive elements 212, 222 can affect the matching (e.g., the reflection coefficient) at any port of the directional coupler 200 (e.g., at the input-port 201, at the through-port 202, at the coupled-port 203, and/or at the isolated port 204). The third and the fourth adjustable shunt capacitive elements 232, 242 can be adjusted to keep low reflection coefficients at all ports 201, 202, 203, 204 of the directional coupler 200 (e.g., reflection coefficients below at least −10 dB), while adjusting the first and the second adjustable shunt capacitive elements 212, 222 to obtain a certain coupling factor. When the directional coupler 200 is used within the electric circuit 100 of FIG. 1, low reflection coefficients at the ports 201, 202, 203, 204 of the directional coupler 200 can avoid mismatch losses and/or provide a flat frequency response (e.g., comprising less and/or smaller ripples) of the first and second signal path 102, 106 and/or of the compensation circuit 110, for example.

Additionally, the first T-network 210 can further comprise a first series capacitive element coupled between the input-port 201 and the central node 211 of the first T-network 210 and can comprise a second series capacitive element coupled between the central node 211 of the first T-network 210 and the isolated-port 204. The second T-network 220 can further comprise a third series capacitive element coupled between the through-port 202 and the central node 221 of the second T-network 220 and can comprise a fourth series capacitive element coupled between the central node 221 of the second T-network 220 and the coupled-port 203. The additional first and/or second series capacitive element can serve to shift a tuning range of the first adjustable shunt capacitive element 212, whereas the additional third and/or fourth series capacitive element can serve to shift a tuning range of the second adjustable shunt capacitive element 222.

Additionally, the third T-network 230 can further comprise a first series inductive element coupled between the input-port 201 and the central node 231 of the third T-network 230 and can comprises a second series inductive element coupled between the central node 231 of the third T-network 230 and the through-port 202. The fourth T-network 240 can further comprise a third series inductive element coupled between the isolated-port 204 and the central node 241 of the fourth T-network 240 and can comprise a fourth series inductive element coupled between the central node 241 of the fourth T-network 240 and the coupled-port 203.

As adjustable capacitors the first, second, third, and/or fourth adjustable shunt capacitive element 212, 222, 232, 242 can comprise a varactor diode with a bias-tee, for example. A bias voltage of a varactor diode can, for example, be adjusted via an additional digital-to-analog converter comprised by an adjustable shunt capacitive element. Alternatively or additionally, at least one of the first, the second, the third, and the fourth adjustable shunt capacitive element 212, 222, 232, 242 of the directional coupler 200 can comprise a digitally tunable capacitor. A digitally tunable capacitor can comprise a capacitor matrix (e.g., a parallel and or serial connection of capacitors), in which the individual capacitors can be activated or deactivated via switches and a control interface, for example.

The optional first, second, third, and/or fourth series capacitive element can comprise lumped capacitors and/or distributed capacitive elements (e.g., realized by transmission lines and/or conductive pads). The optional first, second, third, and/or fourth series inductive element can comprise lumped inductors and/or distributed inductive elements (e.g., realized by transmission lines and/or conductive pads).

Additionally, the directional coupler 200 can comprise a memory circuit. The memory circuit can comprise information relating at least one coupling factor value of the directional coupler 200 to a capacitance value of at least one digitally tunable capacitor of the directional coupler 200. For example, the first, second, third, and/or fourth adjustable shunt capacitive element 212, 222, 232, 242 can comprise a digitally tunable capacitor (or at least a part of a digitally tunable capacitor). The memory circuit can comprise a table (e.g., a lookup table) listing coupling factor values related to capacitance values of the first, second, third, and/or fourth adjustable shunt capacitive element 212, 222, 232, 242, respectively. To adjust the coupling factor of the directional coupler 200 to a certain coupling factor value, the capacitance values of the first, second, third, and/or fourth adjustable shunt capacitive element 212, 222, 232, 242 causing the desired coupling factor value together with low reflection coefficients can be looked up in this table. The adjustable shunt capacitive element(s) 212, 222, 232, 242 can be adjusted according to the capacitance value(s) looked up in the table of the memory circuit. In the electric circuit 100 of FIG. 1, the control circuit 130 may have access to a memory circuit (or memory circuits) of the first and/or second directional coupler 112, 114, for example.

Generally, a T-network is understood herein as an electrical network (e.g., an electric sub-circuit) comprising at least three circuit elements (e.g., resistive, capacitive, and/or inductive elements, but also other circuit elements such as diodes and/or transistors are possible). Circuit elements of a T-network can be lumped elements and/or distributed elements (e.g., conductive pads and/or transmission lines with a characteristic impedance differing from a system impedance such as 50 Ohms or 75 Ohms, for example). A T-network comprises three terminals, for example, an input terminal, an output terminal and a common terminal (e.g., ground). Each terminal of the T-network is connected by a circuit branch to a central node of the T-network and each circuit branch comprises at least one circuit element. The first, second, third, and/or fourth T-network 210, 220, 230, 240 of the directional coupler 200 may be transformed into an equivalent pi-Network without leaving the scope of the present disclosure.

The directional coupler 200 can be realized on a circuit board and/or as an integrated circuit and/or in coaxial and/or hollow waveguide technology, for example.

Furthermore, the designation of the ports 201, 202, 203, 204 of the directional coupler 200 herein is for a directional coupler that can be used for coupling power out of a signal path (e.g., for the first directional coupler 112 of the electric circuit 100 of FIG. 1, that can couple power out of the first signal path 102 to the compensation circuit 110). If the directional coupler 200 is used for coupling power into a signal path (e.g., as for the second directional coupler 114 of the electric circuit 100 of FIG. 1, that can couple power from the compensation circuit 110 into the second signal path 106), the role of the isolated-port and the coupled-port may be exchanged. In other words, the isolated-port 204 may become the coupled-port so that power can couple to from this coupled-port (e.g., port 204) to the through-port 202. Port 203 may be become an isolated-port with respect to the through-port 202.

More details and aspects are mentioned in connection with the embodiments described above or below. The example shown in FIG. 2 may comprise one or more optional additional features corresponding to one or more aspects mentioned in connection with the proposed concept or one or more examples described above (e.g. FIG. 1) or below (e.g. FIGS. 3A-5).

Figure 3A:
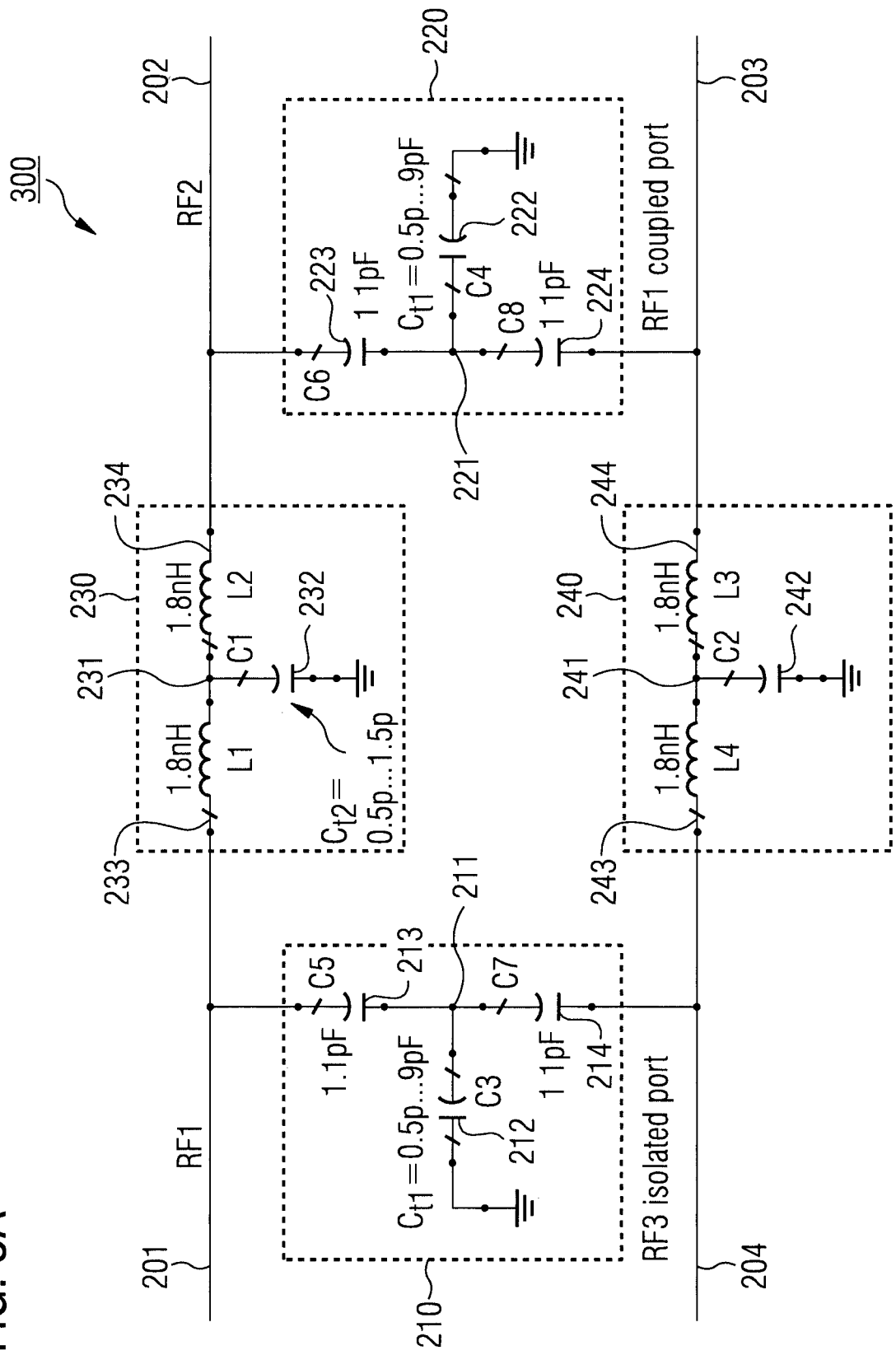
FIG. 3A shows a schematic of an adjustable directional coupler.

FIG. 3A shows a schematic of an adjustable directional coupler 300. The adjustable directional coupler 300 may be similar to the directional coupler 200 of FIG. 2.

The directional coupler 300 comprises an input-port 201, a through-port 202, a coupled-port 203, and an isolated-port 204. A first terminal of a first series capacitive element 213 (labeled as C5) is coupled to the input-port 201, a second terminal of the first series capacitive element 213 is coupled to a first terminal of a second series capacitive element 214 (labeled as C7) and to a first terminal of a first adjustable shunt capacitive element 212 (labeled as C3 with an adjustable capacitance $C_{t1}$). A second terminal of the second series capacitive element 214 is coupled to the isolated-port 204. A second terminal of the first adjustable shunt capacitive element 212 is coupled to ground.

Furthermore, a first terminal of a third series capacitive element 223 (labeled as C6) is coupled to the through-port 202. A second terminal of the third series capacitive element 223 is coupled to a first terminal of a fourth series capacitive element 224 (labeled as C8) and to a first terminal of a second adjustable shunt capacitive element 222 (labeled as C4 with an adjustable capacitance $C_{t1}$). A second terminal of the fourth series capacitive element 224 is coupled to the coupled port 203. A second terminal of the second adjustable shunt capacitive element 222 is coupled to ground.

Moreover, a first terminal of a first series inductive element 233 (labeled as L1) is coupled to the input-port 201 and to the first terminal of the first series capacitive element 213. A second terminal of the first series inductive element 233 is coupled to a first terminal of a second series inductive element 234 (labeled as L2) and to a first terminal of a third adjustable shunt capacitive element 232 (labeled as C1 with an adjustable capacitance $C_{t2}$). A second terminal of the second series inductive element 234 is coupled to the through-port 202 and to the first terminal of the third series capacitive element 223. A second terminal of the third adjustable shunt capacitive element 232 is coupled to ground.

Furthermore, a first terminal of a third series inductive element 243 (labeled as L4) is coupled to the isolated-port 204 and to the second terminal of the second series capacitive element 214. A second terminal of the third series inductive element 243 is coupled to a first terminal of a fourth series inductive element 244 (labeled as L3) and to a first terminal of a fourth adjustable shunt capacitive element 242 (labeled as C1 with an adjustable capacitance $C_{t2}$). A second terminal of the fourth series inductive element 244 is coupled to the coupled-port 203 and to the second terminal of the fourth series capacitive element 224. A second terminal of the fourth adjustable shunt capacitive element 242 is coupled to ground.

The first series capacitive element 213, the second series capacitive element 214, and the first adjustable shunt capacitive element 212 form a first T-network 210 coupled between the input-port 201 and the isolated-port 204. The second terminal of the first series capacitive element 213, the first terminal of the second series capacitive element 214, and the first terminal of the first adjustable shunt capacitive element 212 are located at a central node 211 of the first T-network 210.

The third series capacitive element 223, the fourth series capacitive element 224, and the second adjustable shunt capacitive element 222 form a second T-network 220 coupled between the through-port 202 and the coupled-port 203. The second terminal of the third series capacitive element 223, the first terminal of the fourth series capacitive element 224, and the first terminal of the second adjustable shunt capacitive element 222 are located at a central node 221 of the second T-network 220.

The first series inductive element 233, the second series inductive element 234, and the third adjustable shunt capacitive element 232 form a third T-network 230 coupled between the input-port 201 and the through-port 202. The second terminal of the first series inductive element 233, the first terminal of the second series inductive element 234, and the first terminal of the third adjustable shunt capacitive element 232 are located at a central node 231 of the third T-network 230.

The third series inductive element 243, the fourth series inductive element 244, and the fourth adjustable shunt capacitive element 242 form a fourth T-network 240 coupled between the isolated-port 204 and the coupled-port 203. The second terminal of the third series inductive element 243, the first terminal of the fourth series inductive element 244, and the first terminal of the fourth adjustable shunt capacitive element 242 are located at a central node 241 of the fourth T-network 240.

The first, second, third, and/or fourth T-network 210, 220, 230, 240 can comprise additional circuit elements (e.g., resistive, inductive, and/or capacitive elements, and/or transmission lines and/or conductor pads).

The directional coupler 300 can be symmetrical. For example, the first, second, third, and fourth series capacitive elements 213, 214, 223, 224, can have the same capacitance. For symmetry, the first, second, third, and fourth series inductive elements 233, 234, 243, 244 can have the same inductance. During adjusting the first and the second adjustable shunt capacitive element 212, 222, the capacitance of the first and the second adjustable shunt capacitive element 212, 222 may be adjusted to the same value $C_{t1}$ (e.g., the capacitance of the first adjustable shunt capacitive element 212 may equal the capacitance of the second adjustable shunt capacitive element 222). Furthermore, during adjusting the third and the fourth adjustable shunt capacitive element 232, 242, the capacitance of the third and the fourth adjustable shunt capacitive element 232, 242 may be adjusted to the same value $C_{t2}$ (e.g., the capacitance of the third adjustable shunt capacitive element 232 may equal the capacitance of the fourth adjustable shunt capacitive element 242).

According to an example, the directional coupler 300 is symmetrical. The first and the second adjustable shunt capacitive element 212, 222 can be adjusted within a tuning range of $C_{t1}$=0.5 pF to 9 pF. The third and fourth adjustable shunt capacitive element 232, 242 can be adjusted within a tuning range of $C_{t2}$=0.5 pF to 1.5 pF. The first, second, third, and fourth series capacitive elements 213, 214, 223, 224 comprise each a capacitance of 1.1 pF. The first, second, third, and fourth series inductive elements 233, 234, 243, 244 comprise each an inductance of 1.8 nH (nano-henry). This example of the directional coupler 300 is designed for an operational frequency range between 2 GHz and 3 GHz, for example.

In a first tuning state 301, the first and the second adjustable shunt capacitive element 212, 222 are both adjusted to $C_{t1}$=0.5 pF, and the third and fourth adjustable shunt capacitive element 232, 242 are both adjusted to $C_{t2}$=1.3 pF.

In a second tuning state 302, the first and the second adjustable shunt capacitive element 212, 222 are both adjusted to $C_{t1}$=5.2 pF, and the third and fourth adjustable shunt capacitive element 232, 242 are both adjusted to $C_{t2}$=0.8 pF.

In a third tuning state 303, the first and the second adjustable shunt capacitive element 212, 222 are both adjusted to $C_{t1}$=9 pF, and the third and fourth adjustable shunt capacitive element 232, 242 are both adjusted to $C_{t2}$=0.5 pF.

Figure 3B:
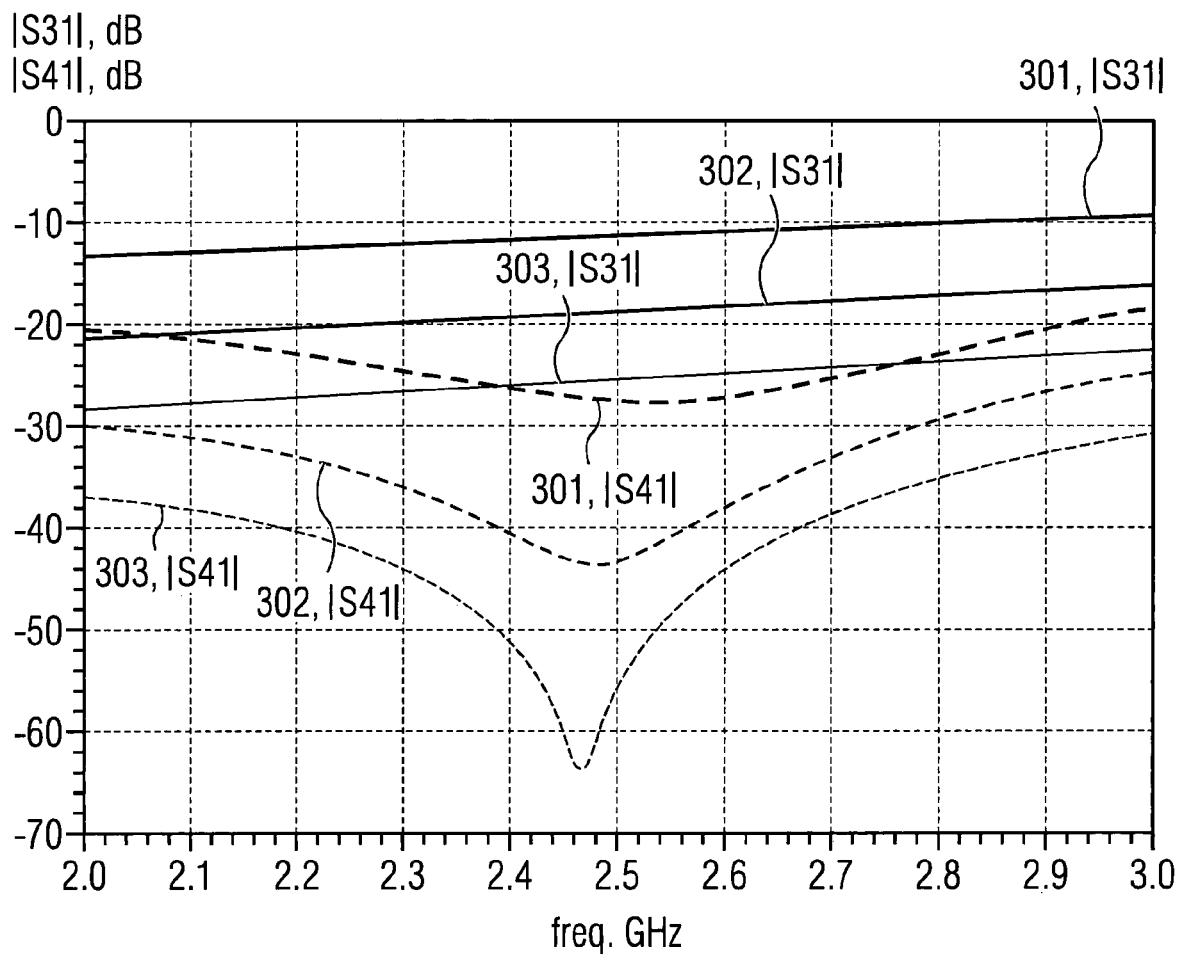
FIG. 3B shows plots of a forward coupling factor from an input-port to a coupled-port and plots of a reverse coupling factor from the input-port to an isolated-port of the adjustable directional coupler of FIG. 3A for three different states of tunable capacitors.

The solids curves of FIG. 3B are simulation results of the magnitude of a forward coupling factor |S31| (in decibel) from the input-port 201 to the coupled-port 203, while the dashed curves of FIG. 3B are simulation results of the magnitude of a reverse coupling factor |S41| (in decibel) from the input-port 201 to the isolated-port 204 of the directional coupler 300 for the first, second, and third tuning state 301, 302, 303. The forward coupling factor corresponds to "the coupling factor" as referred to throughout this disclosure. The reverse coupling factor corresponds to the inverse (e.g., the reciprocal) of the isolation between the input-port 201 and the isolated-port 204. According to FIG. 3B, it is shown, that with practical component values a coupling range of approximately −10 dB to −25 dB can be achieved while maintaining a minimum directivity of 20 dB (the directivity corresponds to |S31| (in dB) minus |S41| (in dB)).

Figure 3C:
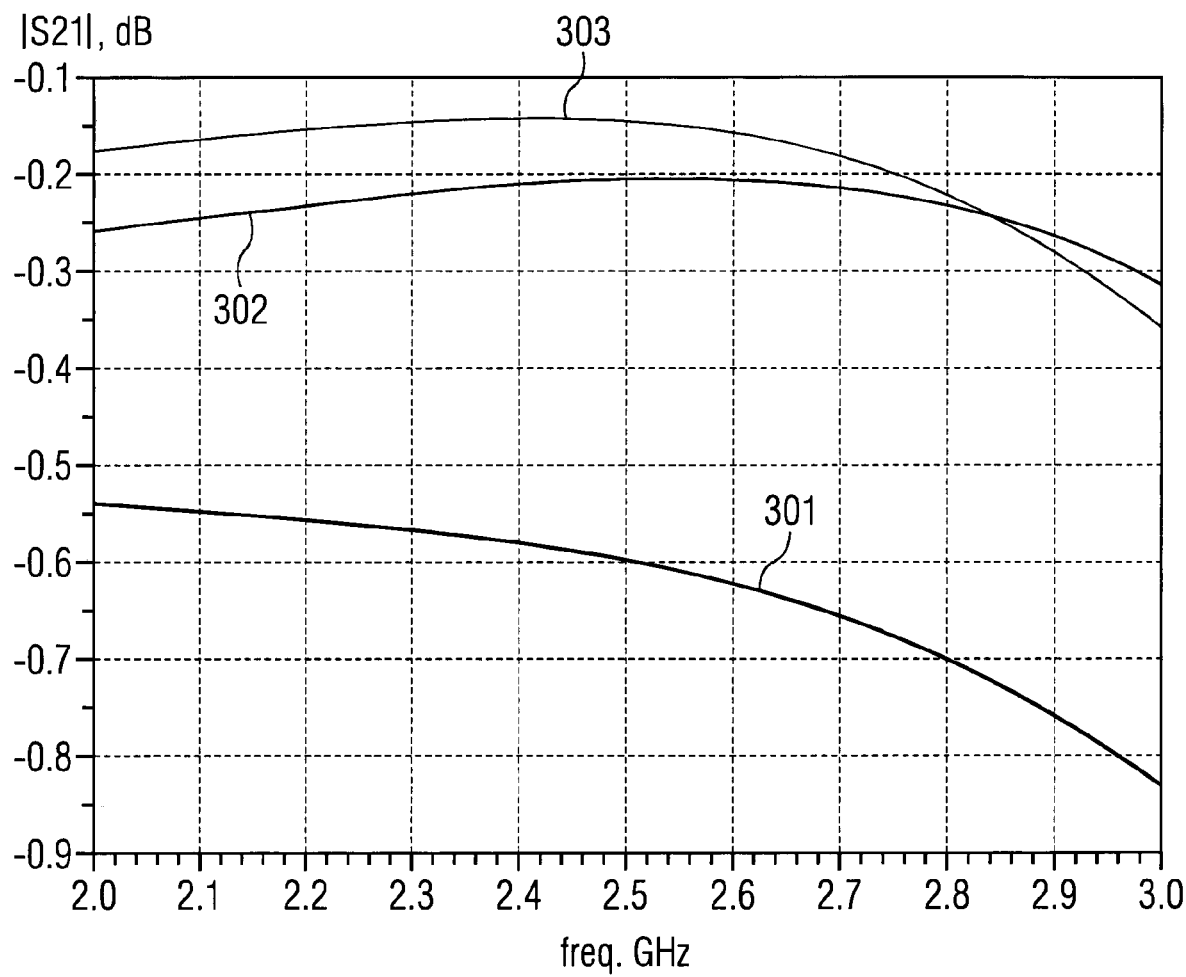
FIG. 3C shows plots of a forward transmission factor from an input-port to a through-port of the adjustable directional coupler of FIG. 3A for three different states of tunable capacitors.

FIG. 3C shows simulation results of the magnitude of a forward transmission factor |S21| (in decibel) from the input-port 201 to the through-port 202 of the exemplary directional coupler 300 for the first, second, and third tuning state 301, 302, 303. The forward transmission factor corresponds to the inverse (e.g., the reciprocal) of the insertion loss between the input-port 201 and the through-port 202. According to FIG. 3C, it is shown, that the insertion loss (between the input-port 201 and the through-port 202) follows the coupling (e.g., forward coupling factor |S31|) inversely, being between approximately 0.15 dB and 0.85 dB. For example, in the first tuning state 301 the forward coupling factor |S31| is high (e.g., between approximately −14 dB and −9 dB) compared to the third tuning state 303, where the forward coupling factor |S31| is relatively small (e.g., between approximately −28 dB and −23 dB). Because the insertion loss may follow the forward coupling factor |S31| inversely, the insertion loss in the first tuning state 301 (ranging between approximately 0.55 dB to 0.85 dB) is higher than in the third tuning state 303, for example. In the third tuning state 303, the insertion loss ranges approximately between 0.15 dB and 0.35 dB.

Figure 3D:
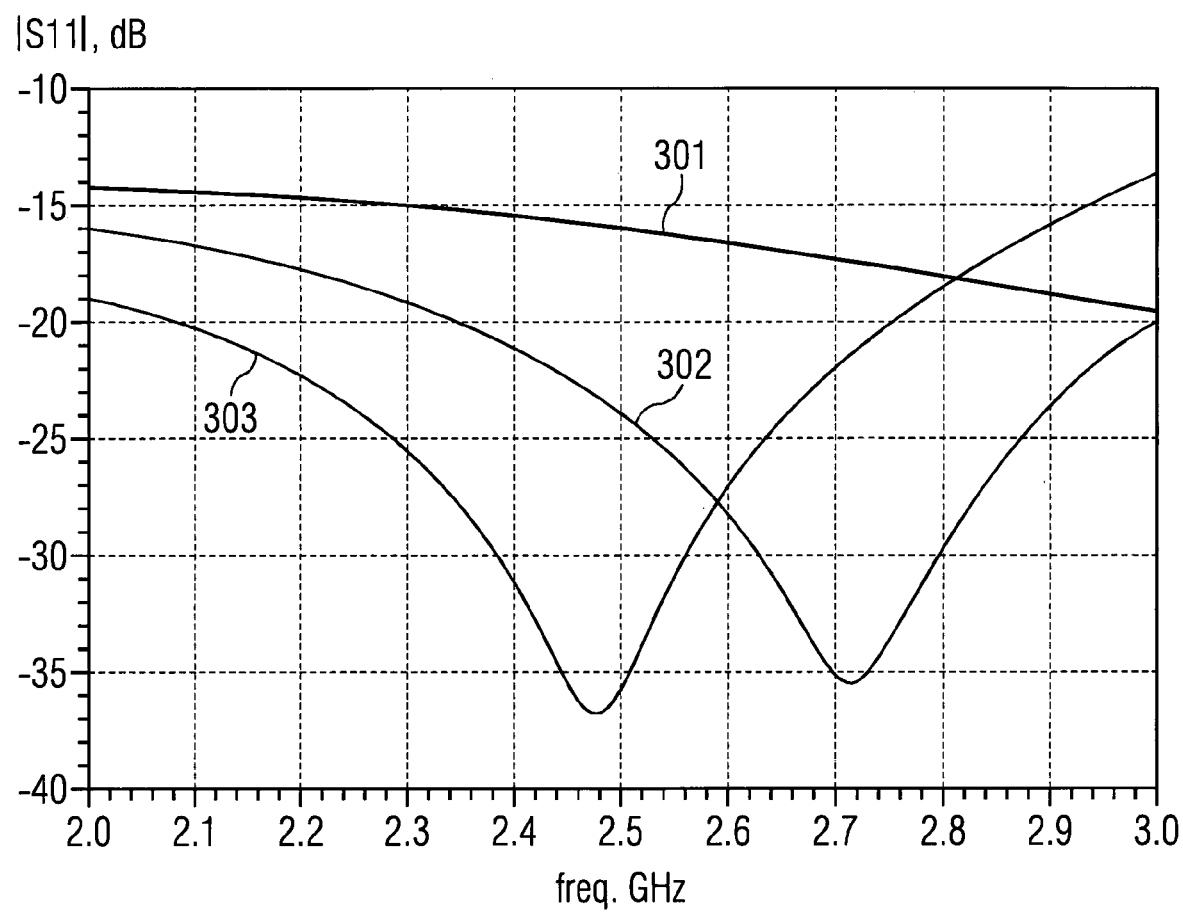
FIG. 3D shows plots of a reflection coefficient of the input-port of the adjustable directional coupler of FIG. 3A for three different states of tunable capacitors.

FIG. 3D shows simulation results of the magnitude of a reflection coefficient |S11| (in decibel) of the input-port 201 of the directional coupler 300 for the first, second, and third tuning state 301, 302, 303. As shown in FIG. 3D, the reflection coefficient |S11| stays below −14 dB for the first, second, and third tuning state 301, 302, 303.

The directional coupler 300 may be also be used in other frequency ranges (e.g., below 2 GHz and/or above 3 GHz) by adapting the capacitance of the first, second, third, and/or fourth series capacitive element 213, 214, 223, 224 and/or by adapting the inductance of the first, second, third, and/or fourth series inductive element 233, 234, 243, 244 and/or by adapting the tuning range of the first, second, third and/or fourth adjustable shunt capacitive element 212, 222, 232, 242.

Figure 3E:
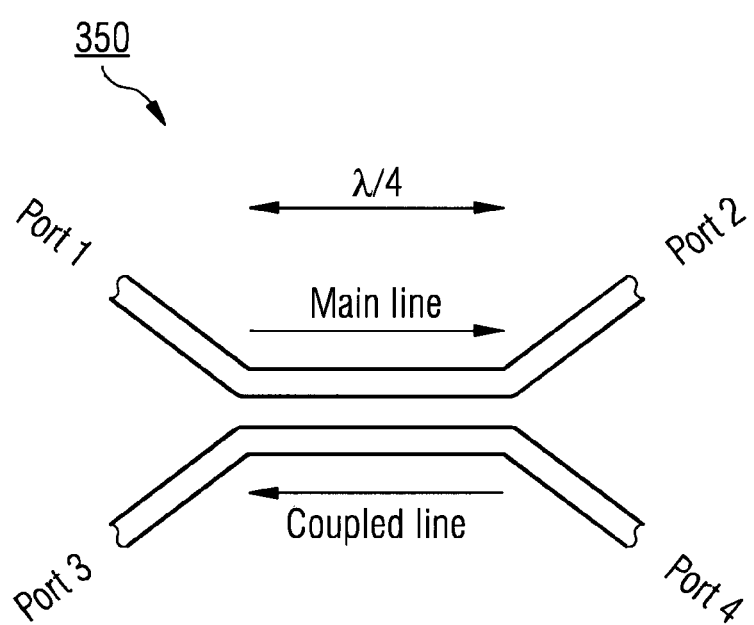
FIG. 3E shows a layout of a directional coupler based on coupled striplines.

FIG. 3E shows a layout of another directional coupler 350. The directional couplers 350 comprises striplines (e.g., micro-striplines) coupled to each other. For example, the striplines are a main line coupled between an input-port (port 1) and a through-port (port 2) of the directional coupler 350 and a coupled line coupled between a coupled port (port 3) and an isolated-port (port 4) of the directional coupler 350. For example, the length of a coupling path along the main line and the coupled line amounts to a quarter wavelength of a signal at an operational frequency of the directional coupler 350. The amount of coupling (e.g., the coupling factor) can be controlled with the distance between the traces (e.g., between the main line and the coupled line). The directional coupler 350 may comprise a fixed coupling factor once the distance between the main line and the coupled line has been set and implemented in the layout of the directional coupler 350.

Figure 3F:
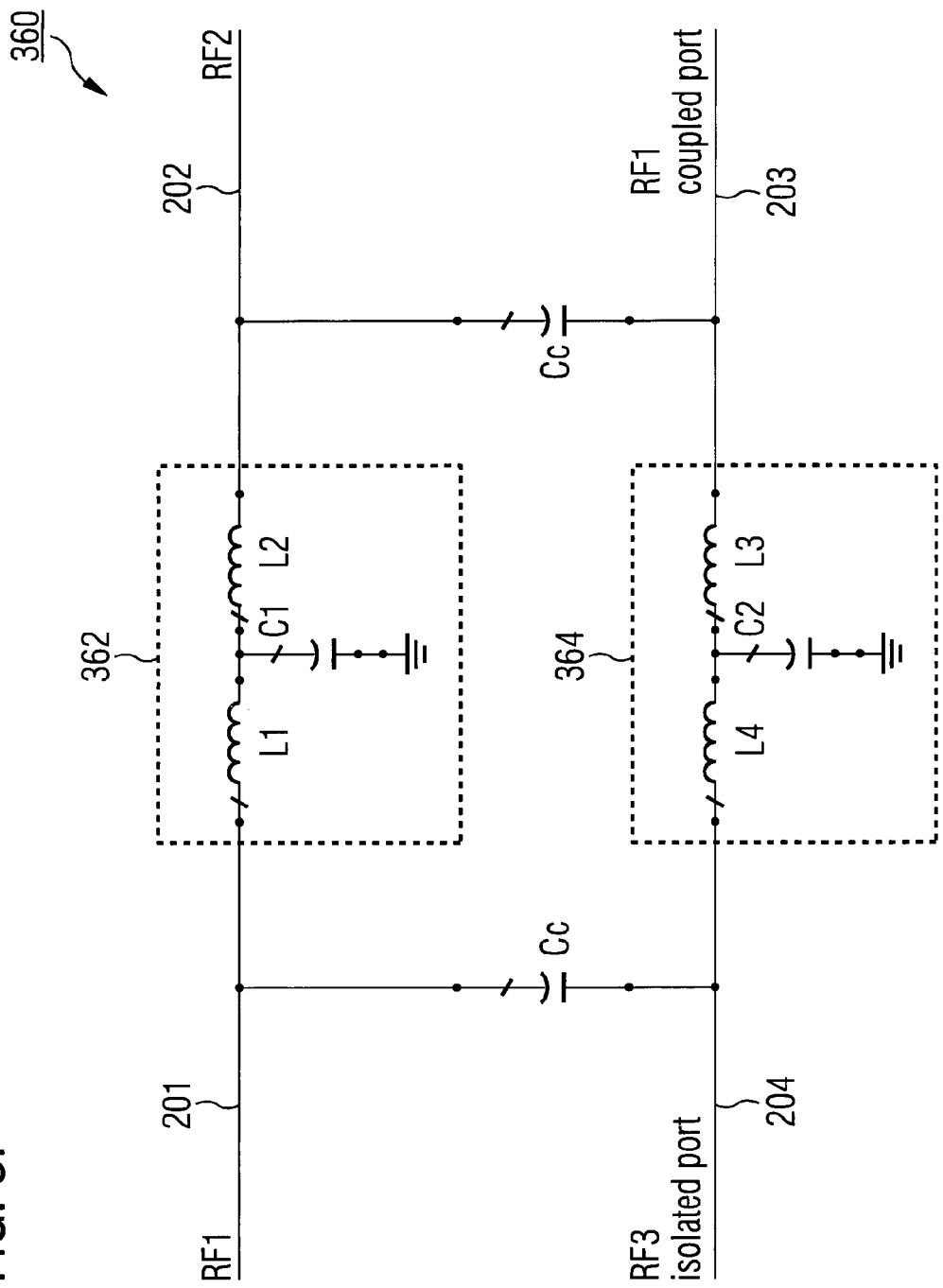
FIG. 3F shows a schematic of a lumped element directional coupler.

Another example of a directional coupler 360 comprising discrete components is shown in FIG. 3F. The transmission line (e.g., the main line and the coupled line) of the directional coupler 350 of FIG. 3E is replaced with an LC (Inductor-Capacitor) equivalent circuit. The topology of the LC equivalent circuit is that of a T-network. The main line is replaced by a first LC equivalent circuit 362 and the coupled line is replaced by a second LC equivalent circuit 364.

The first LC equivalent circuit 362 comprises a first series inductive element (labeled as L1) coupled between an input-port 201 of the directional coupler 360 and a central node of the first LC equivalent circuit 362, a second series inductive element (labeled as L2) coupled between the central node of the first LC equivalent circuit 362 and a through-port 202 of the directional coupler 360, and a first shunt capacitive element (labeled as C1) coupled between the central node of the first LC equivalent circuit 362 and ground.

The second LC equivalent circuit 364 comprises a third series inductive element (labeled as L4) coupled between an isolated-port 204 of the directional coupler 360 and a central node of the second LC equivalent circuit 364, a fourth series inductive element (labeled as L3) coupled between the central node of the second LC equivalent circuit 364 and a coupled-port 203 of the directional coupler 360, and a second shunt capacitive element (labeled as C2) coupled between the central node of the second LC equivalent circuit 364 and ground.

The coupling between the "transmission lines" (e.g., between the input-port 201 and the coupled-port 203) is done with discrete, small value, capacitor Cc. For example, a first coupling capacitor is coupled between the input-port 201 and the isolated-port 204, and a second coupling capacitor is coupled between the through-port 202 and the coupled-port 203. The first and the second coupling capacitor can have the same capacitance value $C_c$ that can be adjusted. To adjust the coupling (e.g., the coupling factor of the directional coupler 360) the value (e.g., the capacitance) of the coupling capacitor $C_c$ can be adjusted. Doing so, can have the following consequences:

Firstly, a tuning range for the capacitor $C_c$ (e.g., the first and/or second coupling capacitor) might be unpractical for tunable capacitor components. For instance, in a radio frequency band 40 (2300 MHz-2400 MHz) the tuning range to yield a coupling range of −10 dB to −20 dB may be 0.1 pF to 0.5 pF, while the minimum parasitic capacitance of a tunable capacitor can be approximately 0.5 pF.

Secondly, changing the coupling capacitor value (e.g., the capacitance of the first and/or second coupling capacitor) can change the loading to the transmission line LC circuit (e.g., the first and/or the second LC equivalent circuit 362, 364) and can cause mismatch. For example, the reflection coefficient at the input-port 201, at the through-port 202, at the coupled-port 203, and/or at the isolated-port 204 may increase. This mismatch can result in a reduced directivity of the directional coupler 360 when the tuning capacitor value (e.g., the capacitance of the first and/or second coupling capacitor) is changed.

To overcome the circumstances stated above, the directional coupler 200 of FIG. 2 and/or the directional coupler 300 of FIG. 3A can be employed, for example.

In the directional coupler 300 coupling between the branches (e.g., between the input-port 201 and the coupled-port 203 of the directional coupler 300) can be done using two fixed pairs of identical capacitors (C5 & C7 and C6 & C8) in series and a tunable capacitor $C_{t1}$ (e.g., the first and second adjustable shunt capacitive element 212, 222) that is connected to ground. This can allow a practically possible tuning range for the tunable capacitor (e.g., the first and second adjustable shunt capacitive element 212, 222). To compensate for the mismatch caused by adjusting the coupling, a second pair of tunable capacitors (e.g., the third and fourth adjustable shunt capacitive element 232, 242) are used in the "transmission line" part (e.g., the third and fourth T-network 230, 240) of the circuit (e.g. the directional coupler 300). Digitally tunable capacitors can comprise various tuning ranges. More than one capacitor bank can be integrated to a single package.

For example, FIG. 3A shows a tunable directional coupler 300. Capacitor $C_{t1}$ can be used to control the coupling between branches, and capacitor $C_{t2}$ can be used to compensate the detuning of the circuit when $C_{t1}$ is adjusted.

More details and aspects are mentioned in connection with the examples described above or below. The example shown in FIGS. 3A-F may comprise one or more optional additional features corresponding to one or more aspects mentioned in connection with the proposed concept or one or more examples described above (e.g. FIGS. 1-2) or below (e.g. FIGS. 4A-5).

The electric circuit 100 can be used in numerous applications. Without limiting the scope of this disclosure, the electric circuit 100 is now explained in more detail in a transceiver application.

Figure 4A:
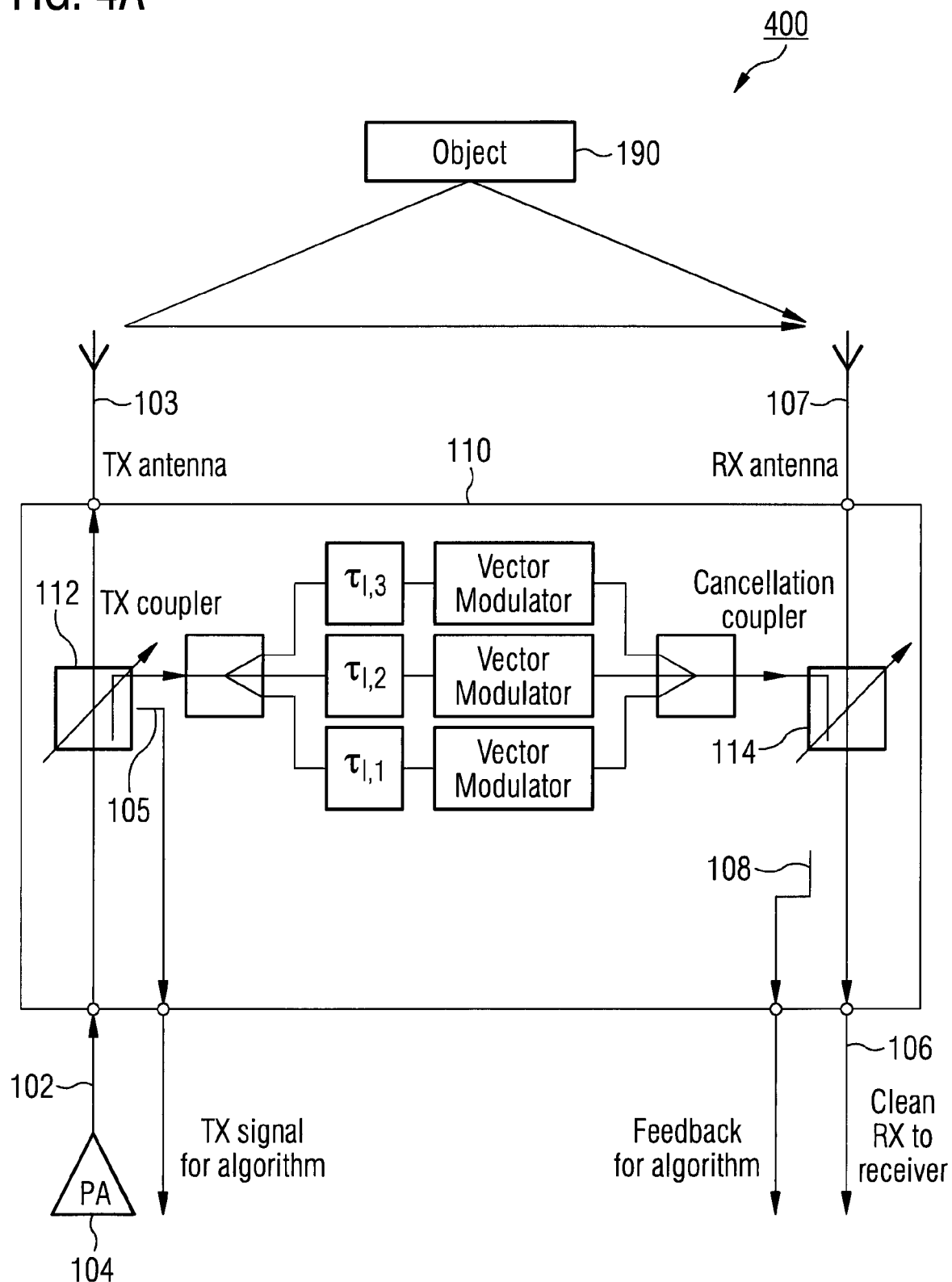
FIG. 4A shows a block diagram of a transceiver.

FIG. 4A shows a block diagram of a transceiver 400. The transceiver 400 comprises a compensation circuit 110. The compensation circuit 110 comprises a first directional coupler 112 and a second directional coupler 114. A first coupling factor of the first directional coupler 112 and a second coupling factor of the second directional coupler 114 are both adjustable. The compensation circuit 110 is coupled between a transmit signal path 102 and a receive signal path 106 of the transceiver 400 via the first and the second directional coupler 112, 114. Furthermore, the transceiver 400 comprises a detector circuit (not shown in FIG. 4A). The detector circuit is coupled at least to the receive signal path 106 and is configured to detect an interfering signal portion of a transmit signal of the transmit signal path 102 in the receive signal path 106. Furthermore, the transceiver 400 comprises a control circuit (not shown in FIG. 4A). The control circuit is configured to adjust a transfer characteristic of the compensation circuit 110 based on the detected interfering signal portion. Adjusting the transfer characteristic comprises adjusting a first portion of an overall attenuation of the compensation circuit 110 via adjusting the first coupling factor and comprises adjusting a second portion of the overall attenuation via adjusting the second coupling factor.

For example, the compensation circuit 110 is coupled to the transmit signal path 102 via the first directional coupler 112 and is coupled to the receive signal path 106 via the second directional coupler 114.

An interfering signal portion due to cross coupling from the transmit signal path 102 to the receive signal path 106 can at least be partially compensated by the compensation circuit 110 in connection with the detector circuit and the control circuit. At the same time, an insertion loss due to the compensation circuit 110 in the transmit signal path 102 and/or in the receive signal path 106 can be reduced (or minimized) with the aid of the first and second adjustable directional coupler 112, 114, respectively. This can allow the transceiver 400 to simultaneously transmit and receive signals. The transmit signals and receive signals may comprise the same frequency (or the same frequency band or at least partially overlapping frequency bands). Hence, a telecommunication system (e.g., a full duplex system) employing the transceiver 400 can operate at an increased bandwidth and/or an increased data rate.

Full duplex systems, in which signals are simultaneously transmitted and received at the same frequency (or in the same frequency-band) can be based on canceling transmit signals (e.g., interfering signal portions of transmit signals, also referred to as echo signal) in the receive signal (e.g., in the receive signal path) by means of analog and digital signal processing. This cancellation can comprise creating a replica of this echo signal (e.g., the interfering signal portion) and subtracting the echo signal from the desired signal (e.g., the receive signal) at the receiver part (e.g., the receive signal path 106) of the transceiver 400.

Cross coupling (or self-interference) from the transmit signal path 102 to the receive signal path 106 can occur due to crosstalk from a transmit antenna 103 and to a receive antenna 107 of the transceiver 400, for example. As indicated in FIG. 4A a first and a second cross coupling path exist between the transmit antenna 103 and the receive antenna 107. The first cross coupling path corresponds to an undesired direct line of sight connection and the second cross coupling path corresponds to an undesired reflected path due to a reflection of the transmit signal at an object 190 exterior to the transceiver 400.

Figure 4B:
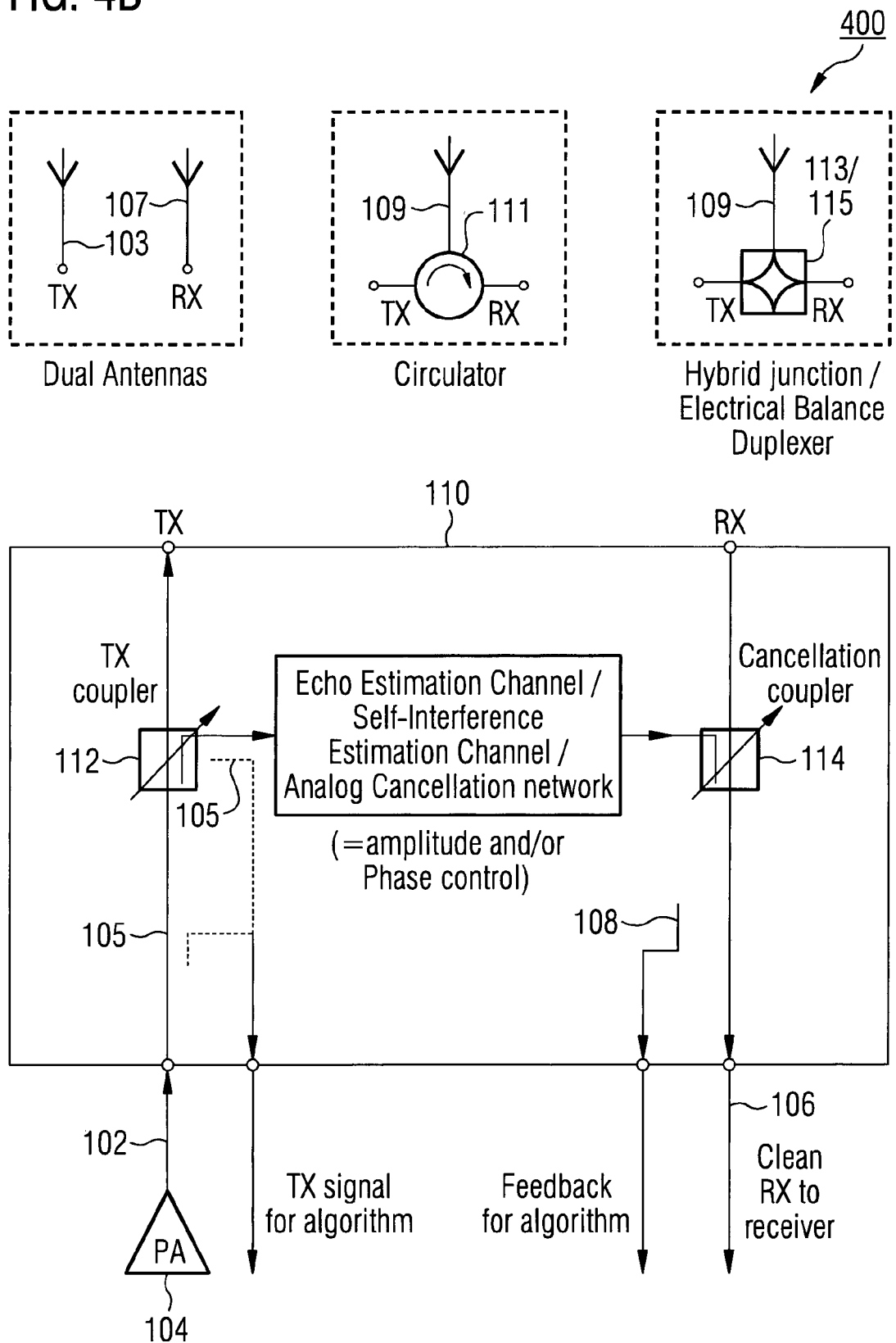
FIG. 4B shows a further block diagram of the transceiver with different antenna configurations.

As illustrated in FIG. 4B, the transceiver 400 can alternatively comprise a transceive antenna 109 that is used for both transmitting and receiving. This may avoid coupling between separate transmit and receive antennas, but crosstalk between the transmit signal path 102 and the receive signal path 106 can occur nevertheless due to the finite return loss of the transceive antenna 109 and/or due to the finite isolation of a circulator 111 or of a hybrid junction 113 or of an electrical balance duplexer 115 used for connecting the transceive antenna 109 to the transmit signal path 102 and to the receive signal path 106. Dual antennas (e.g., separate transmit and receive antennas) or a transceive antenna 109 together with a circulator 109, a hybrid junction 113 or an electrical balance duplexer 115 can provide configurations to provide initial isolation between the transmit signal path 102 and the receive signal path 106.

The echo estimation channel (or self-interference estimation channel, or analog cancellation network) shown in FIG. 4B and coupled between the first and the second adjustable directional coupler 112, 114 corresponds to the part of the compensation circuit 110 (shown in FIG. 4A) coupled between the first and the second adjustable directional coupler 112, 114 of the transceiver 400 of FIG. 4A. For example, the echo estimation channel can comprise at least one of an adjustable attenuator (or adjustable attenuators), a phase shifter (or phase shifters), and a vector modulator (or a plurality of vector modulators connected in parallel via a power divider at their inputs and a power combiner at their outputs). Additionally, a vector modulator (or vector modulators) of the echo estimation channel may be connected in series to a delay line (or delay lines, respectively).

A challenge in the analog part of the transceiver 400 (e.g., in the transmit and/or receive signal path 102, 106 and at the transmit, receive, and/or transceive antenna) is the dynamics in the antenna coupling (or in the cross coupling between the transmit and the receive signal path 102, 106). For example, the attenuation (e.g., the magnitude of the cross coupling) between the receive signal path and transmit signal path at the antenna ports changes when the environment of the antennas changes, for example, when the object 190 moves relative to the transceiver 400. Due to this reason, the analog canceller circuitry (e.g., the compensation circuit 110) can have a relatively large dynamic range in order to be able to compensate interfering signal portions of strongly varying magnitude. The large dynamic range of the compensation circuit 110 can be at least partially achieved by using a vector modulator (in the compensation circuit 110). However, the dynamic range of the compensation circuit 110 can be enhanced by adjustable directional couplers that represent another means of amplitude control.

As displayed in FIG. 4A, the transceiver 400 comprises three vector modulators (but can also comprise less than or more than three vector modulators). Each vector modulator is coupled to a dedicated delay line (labeled as $\tau_{I,1}$, $\tau_{I,2}$, and $\tau_{I,3}$). The combinations of a vector modulator together with a delay line are connected in parallel by employing a power splitter at the inputs of the delay lines and by employing a power combiner at the outputs of the vector modulators. The delays of the delay line can be set to approximately the propagation times of cross-coupling paths occurring in the transceiver 400 and can comprise fixed and/or adjustable values. For example, each combination of a vector modulator together with a delay line can be used for compensating a cross-coupling path. Each vector modulator can comprise an integrated adjustable attenuator (and/or an integrated amplifier) and an adjustable phase shifter.

The first and second adjustable directional coupler 112, 114 can provide flexibility into the system (e.g., the transceiver 400) as depending on the antenna isolation (or cross coupling between the transmit signal path 102 and the receive signal path 106) more (or less) power can be coupled to the compensation circuit 110 if required.

Figure 4C:
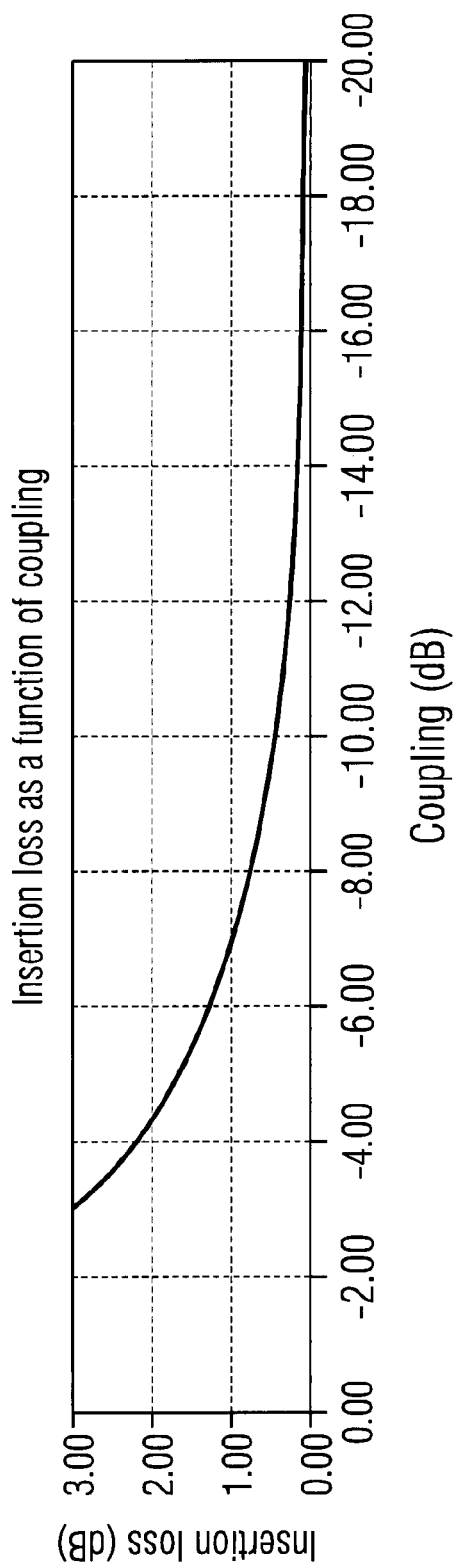
FIG. 4C shows a plot of the insertion loss of a through-path of a directional coupler depending on the coupling factor of the directional coupler.

On the contrary, if, for example in other transceivers, the coupling factor of the first and the second directional coupler are fixed (e.g., are not adjustable), the coupling factor of the first and the second directional coupler may be set to relatively high values (e.g., above −10 dB, or above −6 dB) in order to be able to compensate interfering signal portions of high magnitude during a worst case crosstalk scenario, for example. However, higher coupling factors can also introduce higher insertion loss due to higher coupling losses in the transmit signal path 102 and/or in the receive signal path 106. This is illustrated in FIG. 4C, which shows a plot of the (mathematical) insertion loss from the input-port to the through-port of a directional coupler as a function of the coupling factor. A lower coupling factor corresponds to a lower insertion loss due to lower coupling loss. In situations when crosstalk between the transmit signal path 102 and the receive signal path 106 is lower, such high coupling factors may be unnecessary and/or undesired due to the increased insertion loss in the transmit signal path 102 and/or in the receive signal path 106. With at least one adjustable directional coupler insertion loss in the transmit signal path 102 and/or in the receive signal path 106 can be reduced when crosstalk is lower than in the mentioned worst case crosstalk scenario, for example.

Reduced insertion loss in the transmit signal path 102 can increase a transmit power efficiency of the transceiver 400 as a power amplifier 104 may avoid producing additional power to compensate the higher insertion loss. Additionally, the power amplifier 104 can be operated at a larger power back-off from its third-order intermodulation point. This may improve an intermodulation distance of the transmit signal provided at the output of the power amplifier 102. To compensate nonlinear distortions of the power amplifier 104 that are also contained in the interfering signal portion, the first directional coupler 112 can be coupled between the power amplifier 104 (e.g., the last active device in the transmit signal path 102 before the transmit signal reaches the transmit or transceive antenna) and the transmit antenna 103 and/or receive antenna 109. Of course, additional passive circuitry such as filter or matching circuitry may be located between the first directional coupler 112 and the power amplifier 104 and/or may be located between the first directional coupler 112 and the transmit antenna 103 (or transceive antenna 109).

In cases of high output power of the power amplifier 104 (e.g., when a strength of the transmit signal exceeds a transmit signal strength threshold), an adjustable first directional coupler 112 can be set to a lower coupling factor to avoid an overdrive of the vector modulators of the compensation circuit 110, for example. To detect the strength (and/or other signal properties such as the phase) of the transmit signal, the transceiver can optionally comprise a transmit signal detector coupler 105 to provide a portion of the transmit signal to the detector circuit, for example. The transmit signal detector coupler 105 can be coupled between the coupled port of the first directional coupler 112 and the power divider (at the vector modulators) and/or can be coupled between the power amplifier 104 and the input-port of the first directional coupler 112, for example (as indicated in FIG. 4B).

Figure 4D:
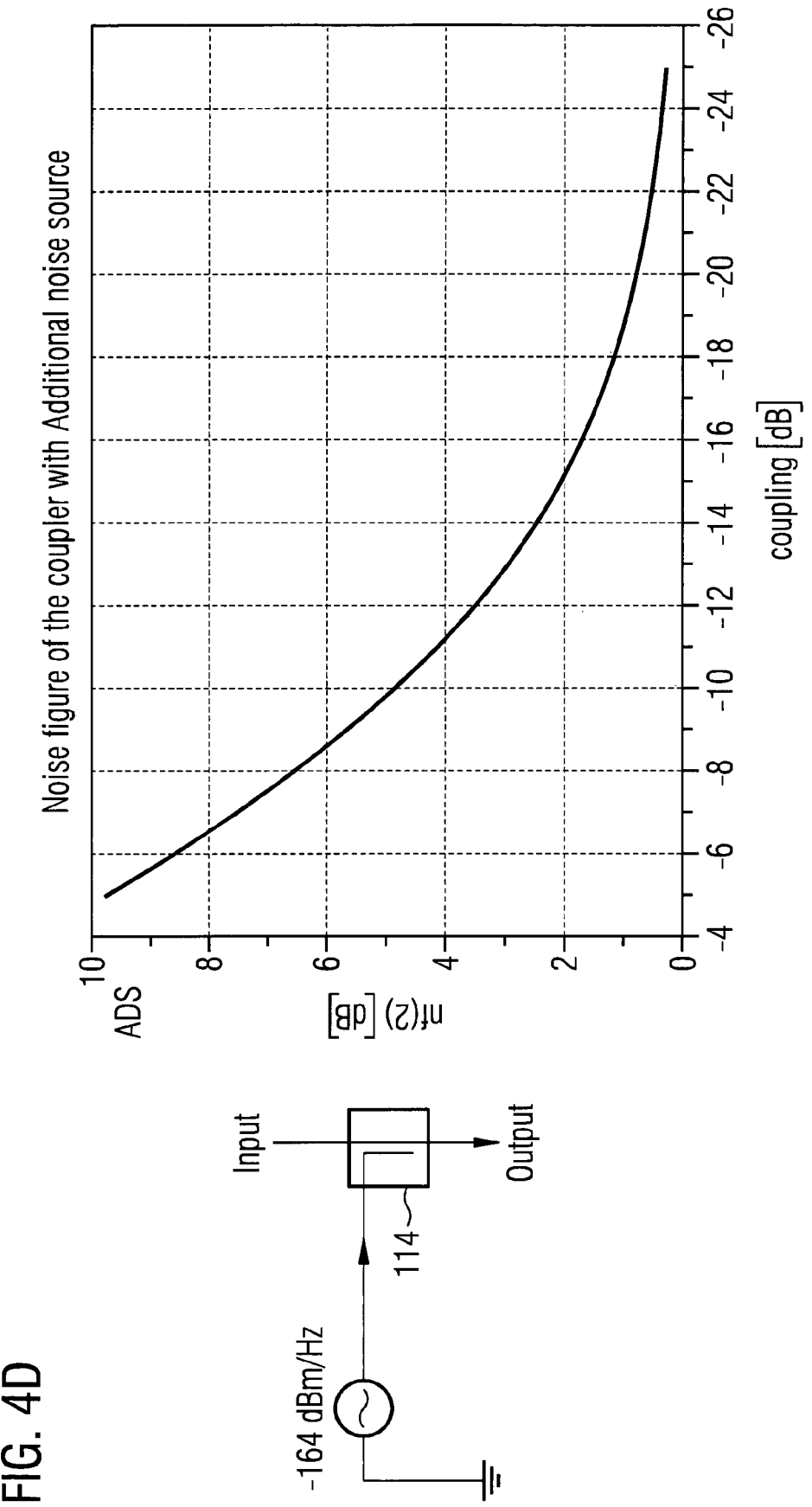
FIG. 4D shows a block diagram of a directional coupler coupled to an additional noise source and a plot of a noise of figure of the directional coupler.

When crosstalk does not amount to the worst case crosstalk scenario, the second adjustable directional coupler 114 can improve the noise figure of the receive signal path 106 by optimizing a trade-off between the insertion loss for the desired receive signal and the cancellation signal (e.g., a compensating signal portion) and/or by attenuating noise generated by the vector modulators by decreasing the coupling factor of the second directional coupler 114. In FIG. 4D, the noise figure of the second directional coupler 114 can be defined as the signal-to-noise-ratio at the input-port (that is coupled to the receive or transceive antenna) of the second directional coupler 114 relative to the signal-to-noise ratio at the through-port (e.g., the output) of the second directional coupler 114. The noise figure of the second directional coupler 114 comprises two contributions. A first contribution is due to the insertion loss between the input-port and the through-port. This insertion loss and thus also the first contribution to the noise figure may decrease with decreasing the coupling factor of the second directional coupler 114. A second contribution to the noise figure is due to noise of vector modulators (or other circuitry such as amplifiers) of the compensation circuit 110. In FIG. 4C, this noise coming from the compensation circuit 110 is modeled with a spectral noise density of −164 dBm/Hz (but may also be lower or higher according to the implementation of the compensation circuit 110). As the coupling factor of the second directional coupler 114 is decreased, less noise may couple from the compensation circuit 110 to the through-port of the second directional coupler 114 and consequently the second contribution to the noise figure may decrease. In FIG. 4D the noise figure of the second directional coupler 114 is plotted versus the coupling factor of the second directional coupler 114. At a coupling factor of −5 dB, the noise figure amounts to almost 10 dB. For a coupling factor of −10 dB the noise figure has decreased to −5 dB. For coupling factors smaller than −20 dB the noise figure falls below 1 dB. Thus FIG. 4D reveals that significant improvements in the noise figure of the second directional coupler and hence in the receive signal path 106 can be achieved if an adjustable directional coupler is employed.

For example, FIG. 4D displays the noise figure of the cancellation coupler (e.g., the second directional coupler 114) as a function of coupling, when the external noise source has a noise power of −164 dBm/Hz. If noise power is different, the input-output noise figure can change too.

For example, the second directional coupler 114 can be coupled between the receive antenna 107 (or transceive antenna 109) and a first active device in the receive signal path 106 (e.g., a low noise amplifier and/or a mixer which may be the closest active and/or nonlinear stage to the receive antenna 107 or transceive antenna 109). In this way, the interfering signal portion can at least be partially compensated before reaching the first active device in the receive signal path 106 and hence not overdrive the first active device.

Of course, additional passive circuitry such as filter or matching circuitry may be located between the receive antenna 107 (or transceive antenna 109) and the second directional coupler 114 and/or may be located between the second directional coupler 114 and the first active device in the receive signal path 106.

For other transceivers (e.g., with fixed directional couplers), the antenna isolation variation (and/or the cross coupling variation between the transmit signal path and the receive signal path) may dictate (or stipulate) the transmit and receive coupling values. A compensation circuit (e.g., an echo cancellation board) can then be designed for a specific application. By providing these parameters (e.g., the coupling factors of the first and/or the second directional coupler 112, 114) as adjustable, a board (e.g., the transceiver 400 and/or the compensation circuit 110) can be optimized for different applications (and/or crosstalk scenarios) by adjusting the coupling factors (of the first and/or the second directional coupler 112, 114). Additionally, there can be a gain in transmit power efficiency as the power amplifier power can be adjusted depending on the antenna isolation, for example.

In other transceivers without adjustable coupler (e.g., where both the first and the second directional coupler are fixed in their coupling factor) the coupling factors may be set for worst case isolation requirements (e.g., when crosstalk is maximal). This means that there can be even up to a few decibels transmit insertion loss, which can increase the power amplifier power consumption. Similarly, a high enough coupling value (e.g., coupling factor) may be chosen for the cancellation coupler (e.g., the second directional coupler) so that the worst case can be covered. This can increase the noise figure, as the insertion loss of the coupler (e.g., the second directional coupler) can be higher and/or the noise from the vector modulator might not be attenuated enough. The transmitter 400 of FIG. 4A can avoid the increased power amplifier power consumption by the adjustable first directional coupler 112 and can avoid the increase in noise figure (in the receive signal path) by the adjustable second directional coupler 114.

Yet another transceiver may use fixed couplers with low coupling and amplification (e.g., an amplifier) and an adjustable attenuator in the cancelling circuit (e.g., the compensation circuit). This however may introduce additional noise from the amplifier. This noise can couple into the receive signal path and may increase the noise figure of the receive signal path. The transmitter 400 can be realized without an amplifier coupled between the first and the second directional couplers 112, 114 and can hence avoid an increase in noise figure of the receive signal path 106, for example.

In implementations of full duplex echo cancellation devices, a vector modulator can be used to control the amplitude and phase as it can provide continuously variable phase and amplitude control. It can work at a high performance when the full dynamic range (of the vector modulator) is not used. For example, at very high attenuations (e.g., at 20 dB or higher) of a vector modulator, the accuracy of the phase control of the vector modulator might not be as high as for lower attenuations (e.g., below 20 dB). In order to cope with antenna isolation changes (or changes in the cross coupling between the transmit signal path and the receive signal path of a transceiver), additional attenuation may be used to enhance performance (e.g., to avoid a decrease in the phase control accuracy of a vector modulator). A variable attenuator may be used to achieve this but a variable (directional) coupler may achieve a higher performance. For example, for the variable attenuator (and a fixed second directional coupler in the receive signal path), the insertion loss in the cancellation coupler (e.g., the second directional coupler) for the desired receive signal may stay the same. This can translate to the noise figure of the receiver (e.g., the receive signal path). Depending on the application, for example in 2×2 MiMo canceller (e.g., multiple-input-multiple-output canceller), there can be two cancellation couplers (e.g., two directional couplers each coupling a dedicated compensation circuit to a first receive signal path): One to cancel TX1-RX1 echo (e.g., an interfering signal portion from a first transmit signal path cross coupling to the first receive signal path) and the other to cancel TX2-RX1 echo (e.g., an interfering signal portion from a second transmit signal path cross coupling to the first receive signal path). As illustrated in FIG. 4C, insertion loss (of a directional coupler) may decrease to a very small level (e.g., below 0.3 dB) when the coupling factor is smaller or equal to −15 dB, for example.

In practice, the noise figure improvement can be higher. The phase and amplitude control can be done using active devices (e.g., vector modulators, phase shifters and/or attenuators) and they can create noise. It might not be possible to cancel this noise because it is created in the device. In other words, noise created by active devices (e.g., vector modulators, phase shifters and/or attenuators) in the compensation circuit might be added to the desired receive signal and decrease the signal-to-noise ratio of the desired signal. This noise might not be compensated by the compensation circuit as it does not originate from (e.g., is not contained in) the interfering signal portion that can be compensated. In the transceiver 400 according to this disclosure, the noise caused by active devices of the compensation circuit 110 can be attenuated (for example, by the adjustable second directional coupler 114). Thus the transceiver 400 can avoid that the noise (caused by the active devices) may end up in the receiver (e.g., in the receive signal path 106) and can avoid that the noise may worsen the noise figure. For example, in the transceiver 400 the number of active devices can be minimized in the echo estimation channel (e.g., in the compensation circuit 110). A lower number of active devices (in the compensation circuit 110) may create less noise, and can avoid that amplification could amplify transmit noise, vector modulator's noise and/or both.

An adjustable coupler (e.g., the first adjustable coupler 112) can also improve performance of the TX chain (e.g., the transmit signal path 102). For example, it might not be desirable to couple high power to the cancellation network (e.g., the compensation circuit 110) as it can create intermodulation distortion. This distortion can end up in the receiver (e.g., in the receive signal path 106). It may be cancelled digitally, but by adjusting the coupling factor of the first directional coupler 112 to a lower value less power may couple to the compensation circuit 110, such that intermodulation distortion at active devices (e.g., vector modulators, phase shifters and/or attenuators) of the compensation circuit 110 can be avoided. By adjusting the transmit coupling value (e.g., the coupling factor of the first directional coupler 112), the system (e.g., the transceiver 400) can react to the changes in the echo channel (e.g., in cross coupling paths), for example a bird flying or standing next to the antenna (e.g., the transmit antenna 103 and/or the receive antenna 107 and/or a transceive antenna 109). In very poor conditions (e.g., when crosstalk between the transmit signal path 102 and the receive signal path 106 is strong), the noise figure may be traded off for higher cancellation power (e.g., a higher strength of the compensating signal portion) but at least the system (e.g., the transceiver 400) can adapt to severe reflections. Also, as depicted in FIG. 4C, the power amplifier power may be increased to compensate the insertion loss of the coupler. In order to cancel strong echoes (e.g., a strong interfering signal portion), the coupling value can be as high as −5 dB which can require at least 1.65 dB more power from the power amplifier 104 to maintain constant transmit power at the antenna (e.g., the transmit antenna 103 or the transceive antenna 109). An adjustable first directional coupler 112 can however avoid having to couple a high portion (e.g., around −5 dB) of the transmit power to the compensation circuit when strong echoes are not present, and can under these conditions cause a lower insertion loss (e.g., lower than 1.65 dB) in the transmit signal path 102. This can enhance the (average) transmit power efficiency.

The adjustable coupler (e.g., the adjustable first and second directional coupler 112, 114) can increase the dynamic range of the echo canceller (e.g., the compensation circuit 110) and can make the noise figure (e.g., of the receive signal path 106) dynamic also such that only in high power echo cases the noise figure may be traded off for good cancellation.

Figure 4E:
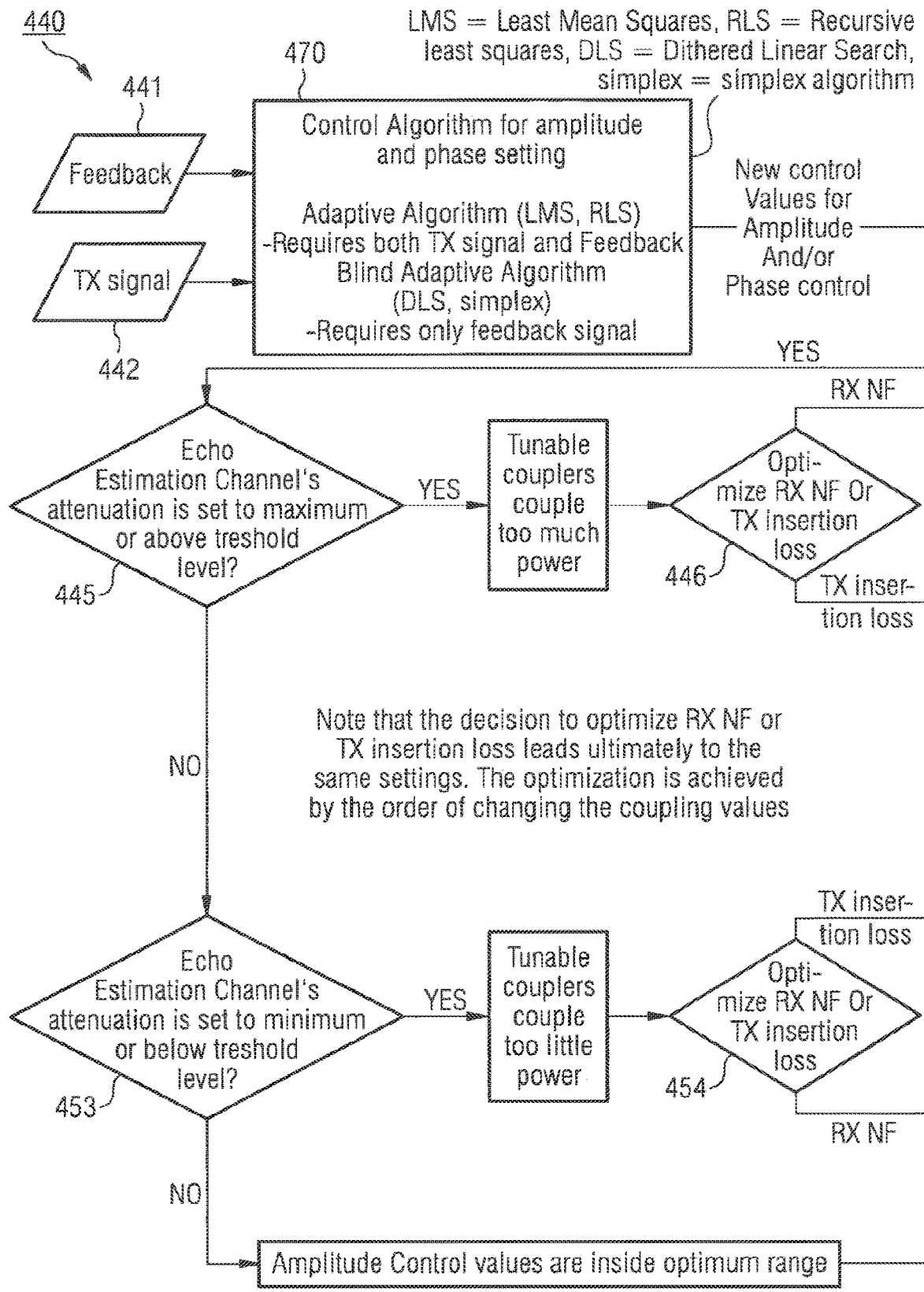
FIG. 4E shows a flow chart of a method for operating a compensation circuit.
Figure 4E:
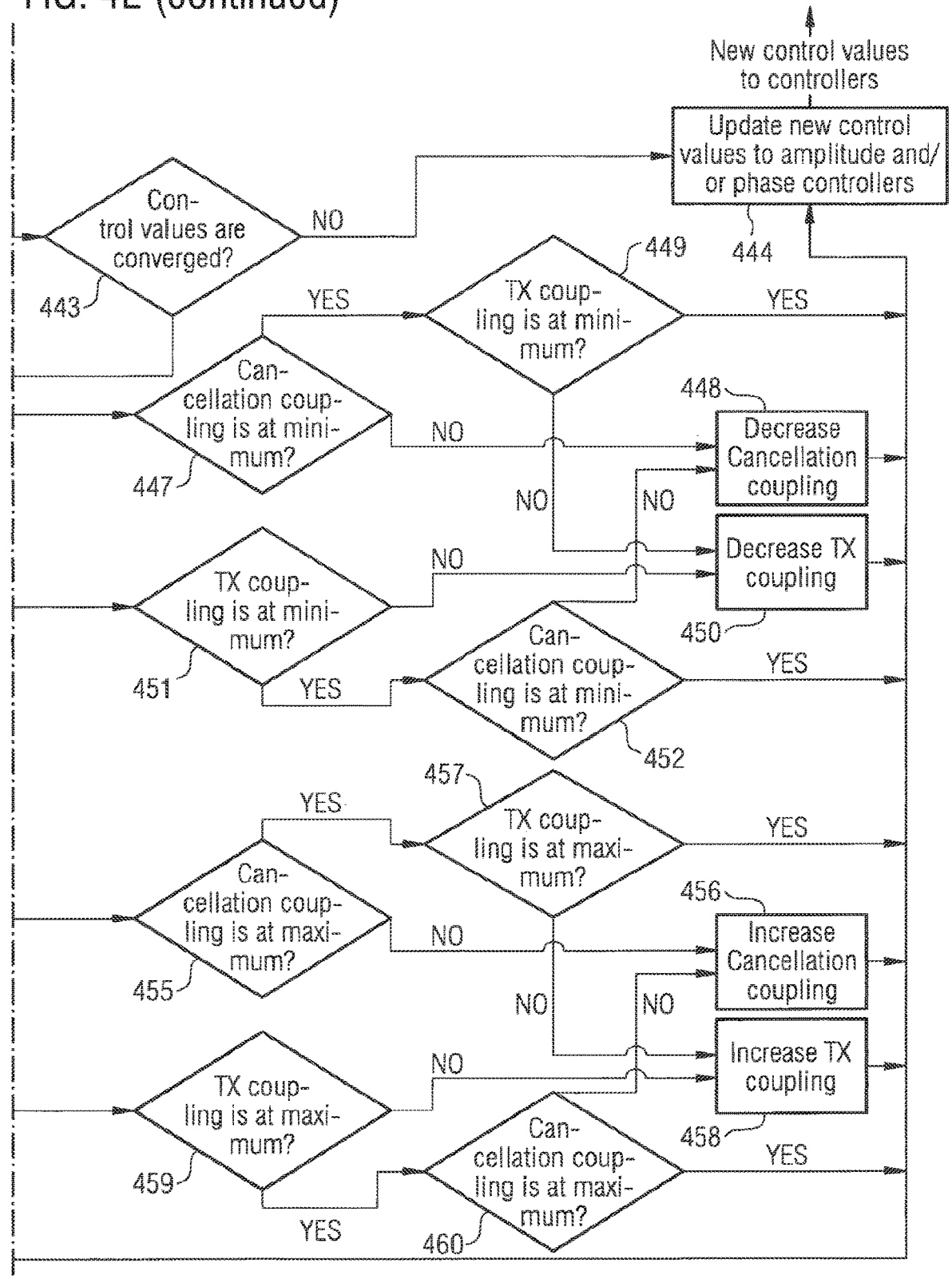

FIG. 4E shows a flow chart of a method 440 for operating the compensation circuit 110 of the transceiver 400. More specifically, FIG. 4E shows a flow chart for amplitude control between tunable couplers (e.g., the first and the second adjustable directional couplers 112, 114) and the echo estimation channel (e.g., an adjustable attenuator and/or a vector modulator of the compensation circuit 110).

The method 440 for operating the compensation circuit 110 comprises receiving 441 a feedback signal. The feedback signal may correspond to the receive signal of the receive signal path after the compensating signal portion has been added to the receive signal. For example, the feedback signal can be the receive signal or can be a portion of the receive signal that is coupled out of the receive signal via an optional feedback directional coupler 108 coupled to the receive signal path 106.

The feedback signal can be fed to the control circuit (for example, via the detector circuit). The method 440 for operating the compensation circuit 110 can optionally comprise also feeding 442 a portion of the transmit signal coupled out of the transmit signal path 102 by the transmit signal detector coupler 105 to the control circuit (for example, via the detector circuit).

The method 440 comprises performing 470 a control algorithm for amplitude and phase setting of the compensation circuit 110 (e.g., for adjusting the transfer characteristic of the compensation circuit 110). The control algorithm can comprise an adaptive algorithm and/or a blind adaptive algorithm to calculate control values for amplitude and/or phase control of the compensation circuit 110. The input to a blind adaptive algorithm may comprise the feedback signal. A blind adaptive algorithm can be a dithered linear search (DLS) algorithm and/or a simplex algorithm, for example. The input to an adaptive algorithm can comprise the feedback signal and the optional portion of the transmit signal. For example, an adaptive algorithm can comprise a least mean square (LMS) and/or a recursive least squares (RLS) algorithm.

To give an example of the possible control algorithms, the application of a least mean square (LMS) algorithm is explained more in detail with aid of FIG. 4F. For example, the LMS algorithm comprises computing 472 the complex conjugate of the portion of the transmit signal x. The LMS algorithm further comprises performing a complex multiplication 474 of the complex conjugate x* of the portion of the transmit signal with the feedback signal z. The LMS algorithm further comprises multiplying 476 the complex product of the complex conjugate x* of the portion of the transmit signal and the feedback signal z with a step size μ. The step size μ can be a real number and can be smaller than one and larger than zero. The LMS algorithm further comprises calculating 478 a new control value $w_{n+1}$ by adding the complex product of the complex conjugate x* of the portion of the transmit signal and the feedback signal z and the step size μ to a former control value $w_n$. The addition for calculating the new control value $w_{n+1}$ can be performed at an integrator and/or at a digital accumulator, for example. The new control value $w_{n+1}$ can be a complex number. The argument of this complex number (e.g., of the new control value $w_{n+1}$) can correspond to the phase control value (e.g., the phase to which the transfer characteristic of the compensation circuit 110 can be adjusted to for compensating the interfering signal portion). The modulus (or absolute value) of the new control value $w_{n+1}$ corresponds to the amplitude control value (e.g., the overall attenuation to which the transfer characteristic of the compensation circuit 110 can be adjusted to for compensating the interfering signal portion).

Turning again to FIG. 4E, after having calculated a new control value $w_{n+1}$, the method 440 comprises checking 443, if the control values (e.g., the new control value $w_{n+1}$) is converged. If the control values are not converged, the method 440 can update 444 the new control value $w_{n+1}$ to the amplitude and/or phase controllers (e.g., to an adjustable attenuator, an adjustable phase shifter, and/or a vector modulator of the compensation circuit 110).

For example, the compensation circuit 110 can further comprise one or more vector modulators. The control circuit can be configured to adjust respective attenuations of the one or more vector modulators based on the detected interfering signal portion and to adjust respective phase shifts of the one or more vector modulators based on the detected interfering signal portion.

If the control values are converged, the method 440 comprises checking 445, if the echo estimation channel's attenuation (e.g., the attenuation of an adjustable attenuator and/or the attenuation of a vector modulator of the compensation circuit 110) exceeds an upper attenuator threshold level. If yes, this can be an indication that the tunable couplers (e.g., the adjustable first and second directional coupler 112, 114) couple too much power (e.g., are set to too high coupling factors). The method 440 may then comprise deciding 446 whether to optimize the noise figure of the receive signal path 106 or the insertion loss in the transmit signal path 102. This decision may be based on a detected strength of the desired receive signal in the receive signal path 106 and/or on a detected strength of the transmit signal in the transmit signal path 102.

For example, the control circuit can be configured to decrease the second coupling factor of the second directional coupler 114 coupling the compensation circuit 110 to the receive signal path 106, if a strength of the (desired) receive signal in the receive signal path 106 falls below a receive signal strength threshold. Furthermore, the control circuit can be configured to decrease the first coupling factor of the first directional coupler 102 coupling the compensation circuit 110 to the transmit signal path 102, if a strength of the transmit signal in the transmit signal path 102 exceeds a transmit signal strength threshold.

In course of the method 440, if it is decided 446 to optimize the noise figure of the receive signal path 106, the method 440 further comprises checking 447 if the coupling factor of the cancellation coupler (e.g., the second directional coupler 114) is set at minimum. If not, the method 440 comprises decreasing 448 the cancellation coupling (e.g., decreasing the coupling factor of the second directional coupler 114). If the coupling factor of the second directional coupler 114 is set at minimum, the method 440 comprises checking 449, if the transmit coupling (e.g., the coupling factor of the first directional coupler 112) is set at minimum. If not, the method 440 comprises decreasing 450 the transmit coupling (e.g., decreasing the coupling factor of the first directional coupler 112). If yes, the method 440 may go to updating 444 the new control value $w_{n+1}$ to the amplitude and/or phase controllers (e.g., to an adjustable attenuator, an adjustable phase shifter, and/or a vector modulator of the compensation circuit 110).

If it is decided 446 to optimize the insertion loss in the transmit signal path 102, the method 440 further comprises checking 451 if the coupling factor of the transmit coupler (e.g., the first directional coupler 112) is set at minimum. If not, the method 440 comprises decreasing 450 the transmit coupling (e.g., decreasing the coupling factor of the first directional coupler 112). If the coupling factor of the first directional coupler 112 is set at minimum, the method 440 comprises checking 452, if the cancellation coupling (e.g., the coupling factor of the second directional coupler 114) is set at minimum. If not, the method 440 comprises decreasing 448 the cancellation coupling (e.g., decreasing the coupling factor of the second directional coupler 114). If yes, the method 440 may go to updating 444 the new control value $w_{n+1}$ to the amplitude and/or phase controllers (e.g., to an adjustable attenuator, an adjustable phase shifter, and/or a vector modulator of the compensation circuit 110).

After having decreased 448 the coupling factor of the second directional coupler 114 and/or after having decreased 450 the coupling factor of the first directional coupler 112, the new control value $w_{n+1}$ may be updated 444 to the amplitude and/or phase controllers. During this update the echo estimation channel's attenuation (e.g., the attenuation of an adjustable attenuator and/or of a vector modulator of the compensation circuit 110) may be decreased in order to maintain the overall attenuation of the compensation circuit. In other words, because the first and/or the second directional coupler may attenuate the compensating signal portion stronger due to a decreased coupling factor, an adjustable attenuator and/or a vector modulator of the compensation circuit 110 may be set for attenuating the compensating signal portion less and may be set to a lower attenuation value.

If checking 445, whether the echo estimation channel's attenuation exceeds an upper attenuator threshold level, reveals that the upper attenuator threshold level is not exceeded, the method 440 comprises checking 453, if the echo estimation channel's attenuation falls below a lower attenuator threshold level. If it does, this can be an indication that the tunable couplers (e.g., the adjustable first and second directional coupler 112, 114) couple too little power (e.g., are set to too low coupling factors), which might not be high enough for compensating the interfering signal portion. The method 440 may then comprise deciding 454 whether to optimize the insertion loss in the transmit signal path 102 or the noise figure of the receive signal path 106. This decision may be based on a detected strength of the transmit signal in the transmit signal path 102 and/or on a detected strength of the desired receive signal in the receive signal path 106.

If it is decided 454 to optimize the insertion loss of the transmit signal path 102, the method 440 further comprises checking 455 if the coupling factor of the cancellation coupler (e.g., the second directional coupler 114) is set at maximum. If not, the method 440 comprises increasing 456 the cancellation coupling (e.g., increasing the coupling factor of the second directional coupler 114). If the coupling factor of the second directional coupler 114 is set at maximum, the method 440 comprises checking 457, if the transmit coupling (e.g., the coupling factor of the first directional coupler 112) is set at maximum. If not, the method 440 comprises increasing 458 the transmit coupling (e.g., increasing the coupling factor of the first directional coupler 112). If yes, the method 440 may go to updating 444 the new control value $w_{n+1}$ to the amplitude and/or phase controllers (e.g., to an adjustable attenuator, an adjustable phase shifter, and/or a vector modulator of the compensation circuit 110).

If it is decided 454 to optimize the noise figure of the receive signal path 106, the method 440 further comprises checking 459 if the coupling factor of the transmit coupler (e.g., the first directional coupler 112) is set at maximum. If not, the method 440 comprises increasing 458 the transmit coupling (e.g., increasing the coupling factor of the first directional coupler 112). If the coupling factor of the first directional coupler 112 is set at maximum, the method 440 comprises checking 460, if the cancellation coupling (e.g., the coupling factor of the second directional coupler 114) is set at maximum. If not, the method 440 comprises increasing 456 the cancellation coupling (e.g., increasing the coupling factor of the second directional coupler 114). If yes, the method 440 may go to updating 444 the new control value $w_{n+1}$ to the amplitude and/or phase controllers (e.g., to an adjustable attenuator, an adjustable phase shifter, and/or a vector modulator of the compensation circuit 110).

After having increased 456 the coupling factor of the second directional coupler 114 and/or after having increased 458 the coupling factor of the first directional coupler 112, the new control value $w_{n+1}$ may be updated 444 to the amplitude and/or phase controllers. During this update the echo estimation channel's attenuation (e.g., the attenuation of an adjustable attenuator and/or of a vector modulator of the compensation circuit 110) may be increased in order to maintain the overall attenuation of the compensation circuit 110. In other words, because the first and/or the second directional coupler 112, 114 may attenuate the compensating signal portion less due to an increased coupling factor, an adjustable attenuator and/or a vector modulator of the compensation circuit 110 may be set for attenuating the compensating signal portion more and may be set to a higher attenuation value.

If checking 445 reveals that the echo estimation channel's attenuation does not exceed the upper attenuator threshold level, and if checking 453 reveals that the echo estimation channel's attenuation does not fall below the lower attenuator threshold level, this can be indicative for that the amplitude control values (e.g., the echo estimation channel's attenuation) are inside optimum range. The method 440 may go to updating 444 the new control value $w_{n+1}$ to the amplitude and/or phase controllers (e.g., to an adjustable attenuator, an adjustable phase shifter, and/or a vector modulator of the compensation circuit 110).

By applying the method 440 for operating the compensation circuit 110 the overall attenuation of the compensation circuit 110 can be shared (or distributed) between the adjustable attenuator(s) and/or vector modulator(s) of the compensation circuit 110 and the first and/or second directional coupler 112, 114 while improving the noise figure in the receive signal path 106 and/or reducing the insertion loss in the transmit signal path 102.

More details and aspects are mentioned in connection with the examples described above or below. The example shown in FIGS. 4A-F may comprise one or more optional additional features corresponding to one or more aspects mentioned in connection with the proposed concept or one or more examples described above (e.g. FIGS. 1-3F) or below (e.g. FIG. 5).

FIG. 5 shows a flow chart of an interference cancellation method 500. The method 500 comprises coupling a compensation circuit between a first signal path and a second signal path of an electric circuit via a first and a second adjustable directional coupler. Furthermore, the method 500 comprises detecting 520 an interfering signal portion of a signal of the first signal path in the second signal path. Furthermore, the method 500 comprises adjusting 530 a transfer characteristic of the compensation circuit based on the detected interfering signal portion. Adjusting 530 the transfer characteristic comprises adjusting a coupling factor of at least one of the first and the second directional coupler.

By employing the method 500, the interfering signal portion in the second signal path can at least be partially compensated. This can allow conducting signals simultaneously on the first and on the second signal path, which can in turn speed up data processing of the electric circuit and/or increase a data rate of a telecommunication employing the electric circuit. At the same time, by adjusting a coupling factor of at least one of the first and the second directional coupler to adjust the transfer characteristic of the compensation circuit, an insertion loss in the first signal path and/or a noise figure of the second signal path may be decreased. This can lead to a reduction in power consumption of the electric circuit and/or can increase the operational reliability of the electric circuit. For example, the electric circuit may more reliably demodulate weaker signals of the second signal path.

More details and aspects are mentioned in connection with the examples described above or below. The example shown in FIG. 5 may comprise one or more optional additional features corresponding to one or more aspects mentioned in connection with the proposed concept or one or more examples described above (e.g. FIGS. 1-4F) or below.

Some examples relate to a method for improving full duplex echo canceller dynamic range and noise figure. For example, the method can employ tunable directional couplers. According to another aspect of the present disclosure, it is provided a novel tunable directional coupler design. For example, the novel tunable directional coupler design can comprise capacitor banks.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An electric circuit, comprising:
a compensation circuit comprising at least one directional coupler with an adjustable coupling factor, wherein the compensation circuit is coupled between a first signal path and a second signal path of the electric circuit via the at least one directional coupler;
a detector circuit coupled at least to the second signal path and configured to detect an interfering signal portion of a signal of the first signal path in the second signal path; and
a control circuit configured to adjust a transfer characteristic of the compensation circuit based on the detected interfering signal portion to provide a compensating signal portion to the second signal path to cancel, at least in part, the interfering signal portion in the second signal path, wherein adjusting the transfer characteristic comprises adjusting the coupling factor of the at least one directional coupler.

2. The electric circuit of claim 1, wherein the compensation circuit further comprises at least one phase shifter with an adjustable phase shift, wherein the control circuit is configured to adjust the phase shift based on the detected interfering signal portion.

3. The electric circuit of claim 1, wherein the compensation circuit comprises a first directional coupler and a second directional coupler, wherein a coupling factor of at least one of the first and the second directional coupler is adjustable, wherein the compensation circuit is coupled to the first signal path via the first directional coupler and is coupled to the second signal path via the second directional coupler, and wherein the control circuit is configured to adjust the coupling factor of at least one of the first and the second directional coupler based on the detected interfering signal portion.

4. The electric circuit of claim 3, wherein a first coupling factor of the first directional coupler and a second coupling factor of the second directional coupler are both adjustable, wherein the control circuit is configured to adjust a first portion of an overall attenuation of the compensation circuit via adjusting the first coupling factor and to adjust a second portion of the overall attenuation via adjusting the second coupling factor.

5. The electric circuit of claim 4, wherein the control circuit is configured to decrease the coupling factor of the first directional coupler coupling the compensation circuit to the first signal path, if a strength of the signal of the first signal path exceeds a signal strength threshold.

6. The electric circuit of claim 4, wherein the control circuit is configured to adjust the coupling factor of the first directional coupler to a first value given a first strength of the signal of the first signal path and to adjust the coupling factor of the first directional coupler to a second value given a second strength of the signal, wherein the first value is smaller than the second value and the first strength of the signal is larger than the second strength of the signal.

7. The electric circuit of claim 4, wherein the control circuit is configured to decrease the coupling factor of the second directional coupler coupling the compensation circuit to the second signal path, if a strength of a second signal of the second signal path falls below a second signal strength threshold.

8. The electric circuit of claim 4, wherein the control circuit is configured to adjust the coupling factor of the second directional coupler to a first value given a first strength of a second signal of the second signal path and to adjust the coupling factor of the second directional coupler to a second value given a second strength of the second signal, wherein the first value is smaller than the second value and the first strength of the second signal is smaller than the second strength of the second signal.

9. The electric circuit of claim 3, wherein the compensation circuit further comprises at least one attenuator with an adjustable attenuation coupled between the first and the second directional coupler, wherein the control circuit is configured to partially adjust an overall attenuation of the compensation circuit via adjusting the attenuation of the attenuator and to partially adjust the overall attenuation via adjusting the coupling factor of at least one of the first and the second directional coupler.

10. The electric circuit of claim 9, wherein the control circuit is configured to decrease the coupling factor of at least one of the first and the second directional coupler and to decrease the attenuation of the attenuator if the attenuation of the attenuator exceeds an upper attenuation threshold level.

11. The electric circuit of claim 10, wherein the control circuit is configured to increase the coupling factor of at least one of the first and the second directional coupler and to increase the attenuation of the attenuator if the attenuation of the attenuator falls below a lower attenuation threshold level.

12. The electric circuit of claim 11, wherein the control circuit is configured to iteratively adjust the coupling factor of at least one of the first directional coupler and the second directional coupler until the attenuation of the attenuator is set between the lower attenuation threshold level and the upper attenuation threshold level.

13. The electric circuit of claim 1, wherein the compensation circuit comprises at least one vector modulator.

14. The electric circuit of claim 1, wherein the electric circuit comprises a transceiver and wherein the first signal path is a transmit signal path of the transceiver and the second signal path is a receive signal path of the transceiver.

15. The electric circuit of claim 14, wherein the transceiver is configured to transmit a first signal via the first signal path and to simultaneously receive a second signal via the second signal path.

16. The electric circuit of claim 15, wherein the first and the second signal comprise the same frequency.

17. A transceiver comprising:
a compensation circuit comprising a first directional coupler and a second directional coupler, wherein a first coupling factor of the first directional coupler and a second coupling factor of the second directional coupler are both adjustable, wherein the compensation circuit is coupled between a transmit signal path and a receive signal path of the transceiver via the first and the second directional coupler;
a detector circuit coupled at least to the receive signal path and configured to detect an interfering signal portion of a transmit signal of the transmit signal path in the receive signal path; and
a control circuit configured to adjust a transfer characteristic of the compensation circuit based on the detected interfering signal portion, wherein adjusting the transfer characteristic comprises adjusting a first portion of an overall attenuation of the compensation circuit via adjusting the first coupling factor and adjusting a second portion of the overall attenuation via adjusting the second coupling factor.

18. The transceiver of claim 17, wherein the control circuit is configured to decrease the second coupling factor of the second directional coupler coupling the compensation circuit to the receive signal path, if a strength of a receive signal in the receive signal path falls below a receive signal strength threshold.

19. The transceiver of claim 17, wherein the control circuit is configured to decrease the first coupling factor of the first directional coupler coupling the compensation circuit to the transmit signal path, if a strength of the transmit signal in the transmit signal path exceeds a transmit signal strength threshold.

20. An interference cancellation method, comprising:
coupling a compensation circuit between a first signal path and a second signal path of an electric circuit via a first and a second adjustable directional coupler;
detecting an interfering signal portion of a signal of the first signal path in the second signal path; and
adjusting a transfer characteristic of the compensation circuit based on the detected interfering signal portion to provide a compensating signal portion to the second signal path to cancel, at least in part, the interfering signal portion in the second signal path, wherein adjusting the transfer characteristic comprises adjusting a coupling factor of at least one of the first and the second directional coupler.

21. The method of claim 20, wherein adjusting the transfer characteristic further comprises adjusting both a first coupling factor of the first directional coupler and a second coupling factor of the second directional coupler, wherein a first portion of an overall attenuation of the compensation circuit is adjusted via adjusting the first coupling factor, and wherein a second portion of the overall attenuation is adjusted via adjusting the second coupling factor.

* * * * *